(12) United States Patent
Ichikawa

(10) Patent No.: US 10,453,916 B2
(45) Date of Patent: Oct. 22, 2019

(54) SEMICONDUCTOR DEVICE

(71) Applicant: ROHM CO., LTD., Kyoto (JP)

(72) Inventor: Daisuke Ichikawa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/598,723

(22) Filed: May 18, 2017

(65) Prior Publication Data

US 2017/0345887 A1 Nov. 30, 2017

(30) Foreign Application Priority Data

May 24, 2016 (JP) .................. 2016-103579

(51) Int. Cl.
*H01L 29/06* (2006.01)
*H01L 29/40* (2006.01)
*H01L 29/78* (2006.01)
*H01L 29/08* (2006.01)
*H01L 29/423* (2006.01)
*H01L 29/10* (2006.01)

(52) U.S. Cl.
CPC ........ *H01L 29/063* (2013.01); *H01L 29/0696* (2013.01); *H01L 29/0878* (2013.01); *H01L 29/404* (2013.01); *H01L 29/7816* (2013.01); *H01L 29/7835* (2013.01); *H01L 29/1095* (2013.01); *H01L 29/42368* (2013.01)

(58) Field of Classification Search
CPC ............. H01L 29/0878; H01L 29/0873; H01L 29/0882; H01L 29/063; H01L 29/0696; H01L 29/7816; H01L 29/404; H01L 29/7835; H01L 29/1095
See application file for complete search history.

(56) References Cited

U.S. PATENT DOCUMENTS

| | | | | |
|---|---|---|---|---|
| 5,932,897 A | * | 8/1999 | Kawaguchi | H01L 27/088 257/141 |
| 6,380,566 B1 | * | 4/2002 | Matsudai | H01L 29/7816 257/133 |
| 6,642,599 B1 | * | 11/2003 | Watabe | H01L 21/8234 257/328 |
| 7,071,527 B2 | * | 7/2006 | Iwabuchi | H01L 29/0634 257/492 |
| 8,004,040 B2 | * | 8/2011 | Ichijo | H01L 29/0634 257/341 |

(Continued)

FOREIGN PATENT DOCUMENTS

JP 2011-243919 A 12/2011

*Primary Examiner* — Latanya N Crawford

(57) ABSTRACT

A semiconductor device includes: a semiconductor substrate with a first conductivity type; a semiconductor layer with a second conductivity type formed on the semiconductor substrate; a drain region with the second conductivity type and a source region with the second conductivity type formed to be spaced apart from each other in a surface region of the semiconductor layer; a drain buffer region with the second conductivity type formed in the semiconductor substrate directly under the drain region and in the semiconductor layer; a conductivity type well region with the second conductivity type formed on the semiconductor layer between the drain region and the drain buffer region; and a drain metal formed on the drain region to be electrically connected to the drain region and to overlap the well region in a plan view.

7 Claims, 14 Drawing Sheets

(56) References Cited

U.S. PATENT DOCUMENTS

| | | | | |
|---|---|---|---|---|
| 8,129,785 B2* | 3/2012 | Izumi | .................. | H01L 29/0623 257/343 |
| 9,054,070 B2* | 6/2015 | Kaya | ..................... | H01L 29/404 |
| 9,245,997 B2* | 1/2016 | Hebert | ................ | H01L 29/7816 |
| 2002/0060341 A1* | 5/2002 | Terashima | .......... | H01L 29/0619 257/335 |
| 2003/0049907 A1* | 3/2003 | Omi | .................... | H01L 29/1083 438/286 |
| 2008/0303088 A1* | 12/2008 | Pang | ................. | H01L 29/66689 257/337 |
| 2009/0039424 A1* | 2/2009 | Su | ......................... | H01L 29/404 257/339 |
| 2009/0085113 A1* | 4/2009 | Izumi | ................. | H01L 29/0623 257/343 |
| 2009/0159970 A1* | 6/2009 | Ichijo | ................. | H01L 29/0634 257/343 |
| 2011/0186928 A1* | 8/2011 | Ichikawa | ................ | H01L 29/78 257/344 |
| 2014/0167171 A1* | 6/2014 | Kaya | ..................... | H01L 29/404 257/367 |
| 2016/0351708 A1* | 12/2016 | Kameoka | ............ | H01L 29/7824 |

\* cited by examiner

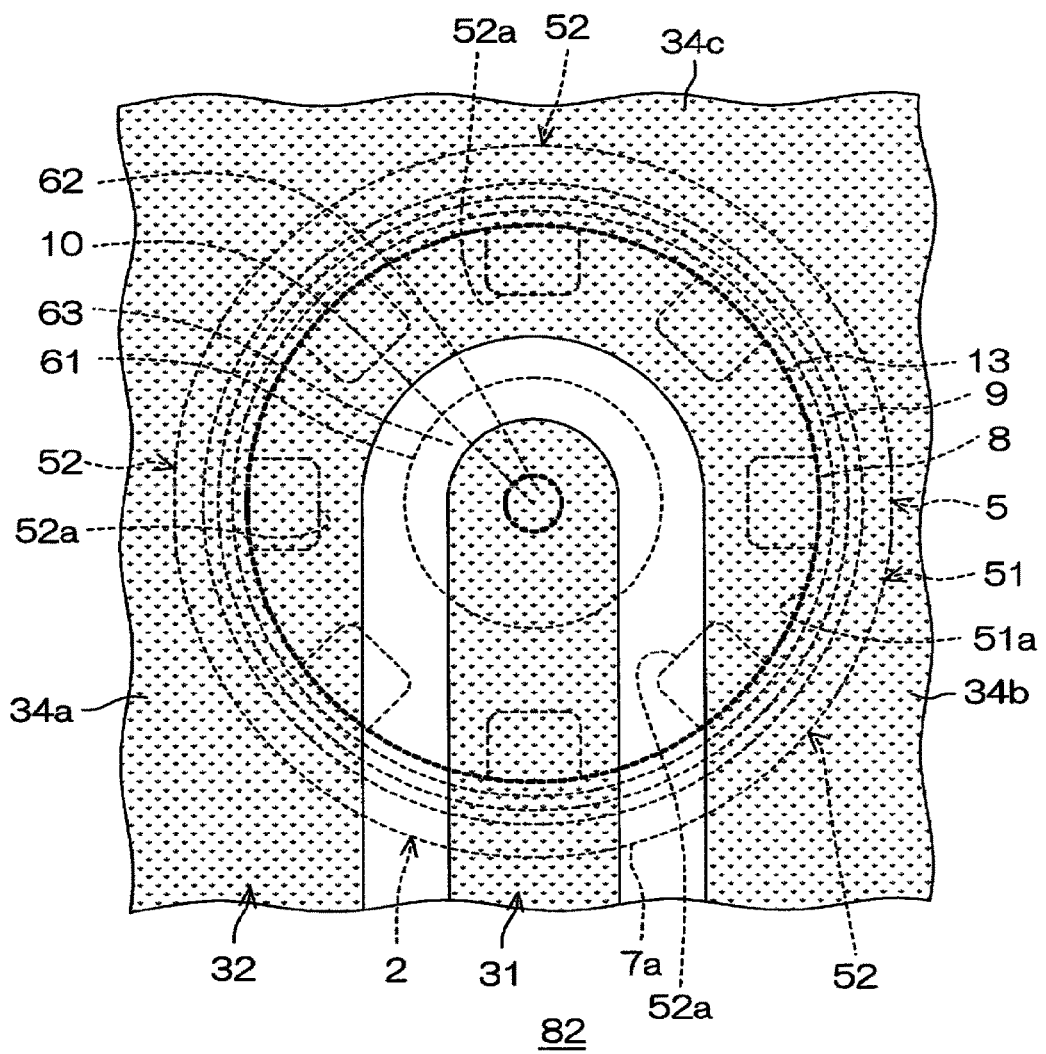

SEMICONDUCTOR DEVICE

CROSS-REFERENCE TO RELATED APPLICATION(S)

This application is based upon and claims the benefit of priority from Japanese Patent Application No. 2016-103579, filed on May 24, 2016, the entire contents of which are incorporated herein by reference.

TECHNICAL FIELD

The present disclosure relates to a semiconductor device.

BACKGROUND

The conventional semiconductor device may include a metal oxide semiconductor field effect transistor (MOSFET). This semiconductor device includes a p-type semiconductor substrate, an n-type semiconductor layer formed on the semiconductor substrate, and an n-type drain region and an n-type source region formed to be spaced apart from each other on a surface region of the semiconductor layer.

In the conventional semiconductor device, a drain metal for supplying electric power to the drain region is typically connected to the drain region. Such a semiconductor device is typically designed to have equipotential lines distributed such that the electric field strength becomes uniform from the drain region to the source region in a state in which a drain voltage is applied.

However, in the configuration in which the drain metal is disposed on the drain region, there is a possibility that the equipotential lines extending from the drain metal are sharply bent toward the drain region near the surface of the semiconductor layer to cause a region where the distances between the equipotential lines in the semiconductor layer are narrow, i.e., a region where the equipotential lines are dense. The region where the equipotential lines are dense is a region where the electric field strength is higher than that of other regions and the electric field is locally concentrated. Such a local electric field concentration has a problem that it causes a reduction in withstand voltage of the semiconductor device.

SUMMARY

The present disclosure provides some embodiments of a semiconductor device capable of suppressing an occurrence of a local electric field concentration between a drain region and a source region and improving a withstand voltage.

According to one embodiment of the present disclosure, there is provided a semiconductor device, including: a semiconductor substrate with a first conductivity type; a semiconductor layer with a second conductivity type formed on the semiconductor substrate; a drain region with the second conductivity type and a source region with the second conductivity type formed to be spaced apart from each other in a surface region of the semiconductor layer; a drain buffer region with the second conductivity type formed in the semiconductor substrate directly under the drain region and in the semiconductor layer; a conductivity type well region with the second conductivity type formed on the semiconductor layer between the drain region and the drain buffer region, the well region having a facing portion facing the drain region and a lead-out portion extending from the facing portion toward the source region; and a drain metal formed on the drain region to be electrically connected to the drain region and to overlap the well region in a plan view, wherein a periphery of the lead-out portion of the well region extends to an outside of a periphery of the drain metal in a plan view.

According to another embodiment of the present disclosure, there is provided a semiconductor device, including: a semiconductor substrate with a first conductivity type; a semiconductor layer with a second conductivity type formed on the semiconductor substrate; a drain region with the second conductivity type and a source region with the second conductivity type formed to be spaced apart from each other in a surface region of the semiconductor layer; a well region with the second conductivity type formed on the semiconductor layer directly under the drain region, the well region having a facing portion facing the drain region and a lead-out portion extending from the facing portion toward the source region; and a drain metal formed on the drain region to be electrically connected to the drain region and to overlap the well region in a plan view, wherein a periphery of the lead-out portion of the well region extends to an outside of a periphery of the drain metal in a plan view.

According to yet another embodiment of the present disclosure, there is provided a semiconductor device, including: a semiconductor substrate with a first conductivity type; a semiconductor layer with a second conductivity type formed on the semiconductor substrate; a drain region with the second conductivity type and a source region with the second conductivity type formed to be spaced apart from each other in a surface region of the semiconductor layer; a drain buffer region with the second conductivity type formed in the semiconductor substrate directly under the drain region and in the semiconductor layer, a periphery of the drain buffer region being extending to an outside of a periphery of the drain region; a well region with the second conductivity type formed on the semiconductor layer between the drain region and the drain buffer region, the well region having a facing portion facing the drain region and a lead-out portion extending from the facing portion toward the source region; and a drain metal formed on the drain region to be electrically connected to the drain region and to overlap the well region in a plan view, wherein a periphery of the lead-out portion of the well region extends to an outside of a periphery of the drain metal in a plan view.

According to a further embodiment of the present disclosure, there is provided a semiconductor device, including: a semiconductor substrate with a first conductivity type; a semiconductor layer with a second conductivity type formed on the semiconductor substrate; a drain region with the second conductivity type and a source region with the second conductivity type formed to be spaced apart from each other in a surface region of the semiconductor layer; a well region with the second conductivity type formed on the semiconductor layer directly under the drain region, the well region having a facing portion facing the drain region and a lead-out portion extending from the facing portion toward the source region; an insulating film formed to cover a region between the drain region and the source region on a surface of the semiconductor layer; a plurality of field plates formed above the insulating film to be in an electrically floating state; and a drain metal formed on the drain region to be electrically connected to the drain region and to overlap the well region in a plan view, wherein the lead-out portion of the well region is formed to overlap a part of the plurality of field plates in a plan view.

BRIEF DESCRIPTION OF THE DRAWINGS

FIG. 14 is a plan view of a semiconductor device according to a second modification of the first embodiment.

DETAILED DESCRIPTION

Embodiments of the present disclosure will be now described in detail with reference to the drawings.
(First Embodiment)

Figure 1:
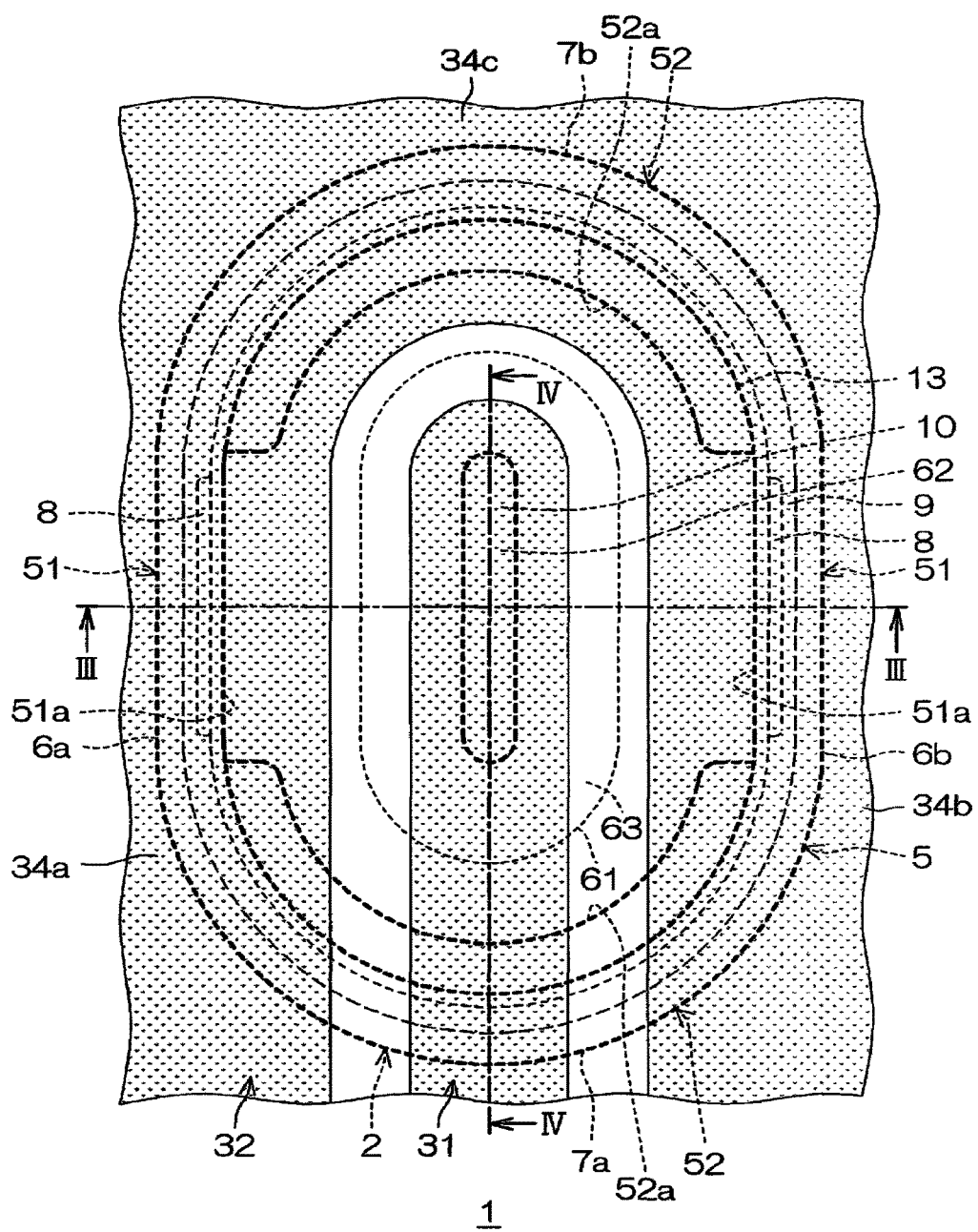
FIG. 1 is a plan view of a semiconductor device according to a first embodiment of the present disclosure.
Figure 2:
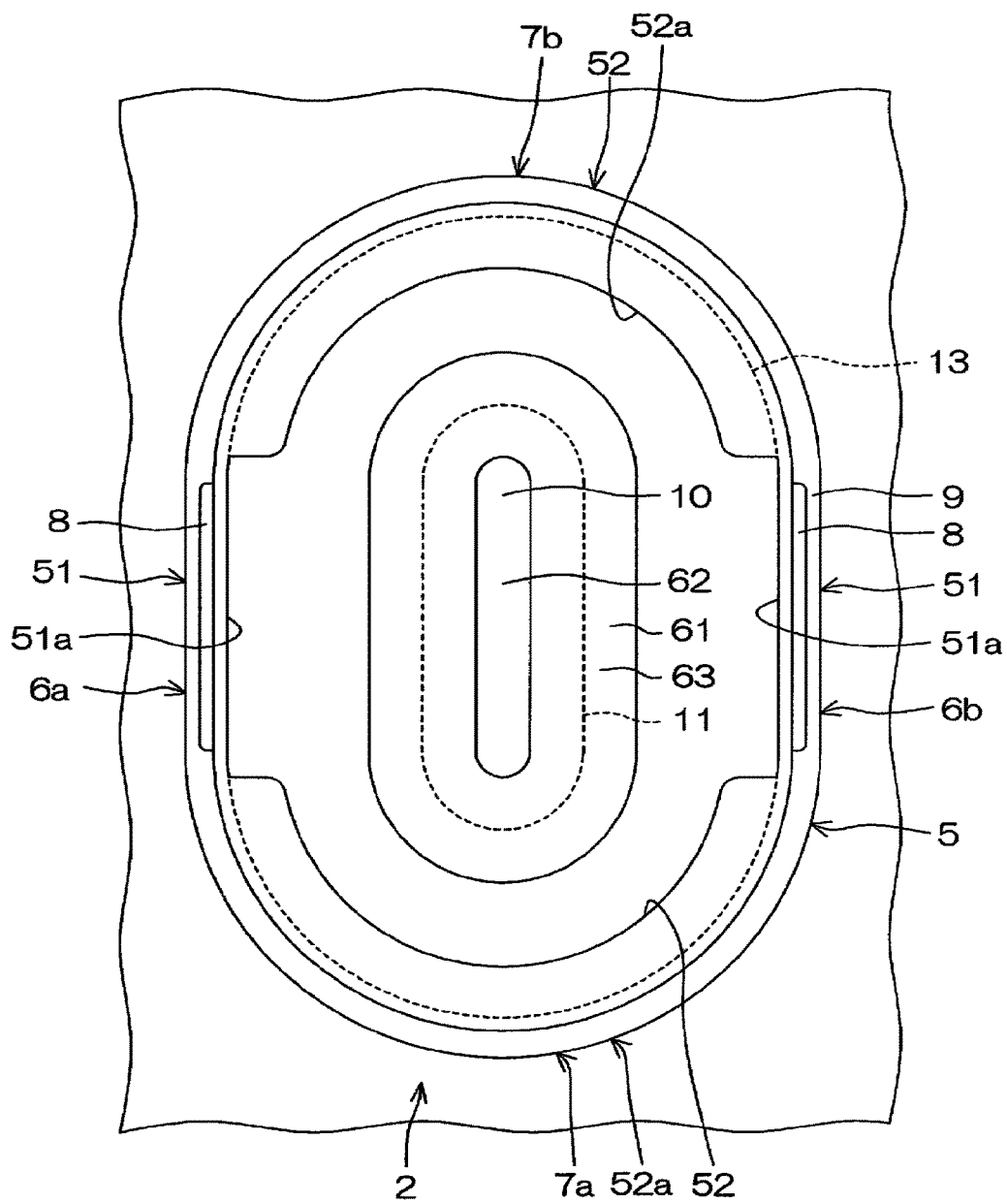
FIG. 2 is a plan view of the semiconductor device of FIG. 1 that shows a configuration in which components on a semiconductor layer are removed.
Figure 3:
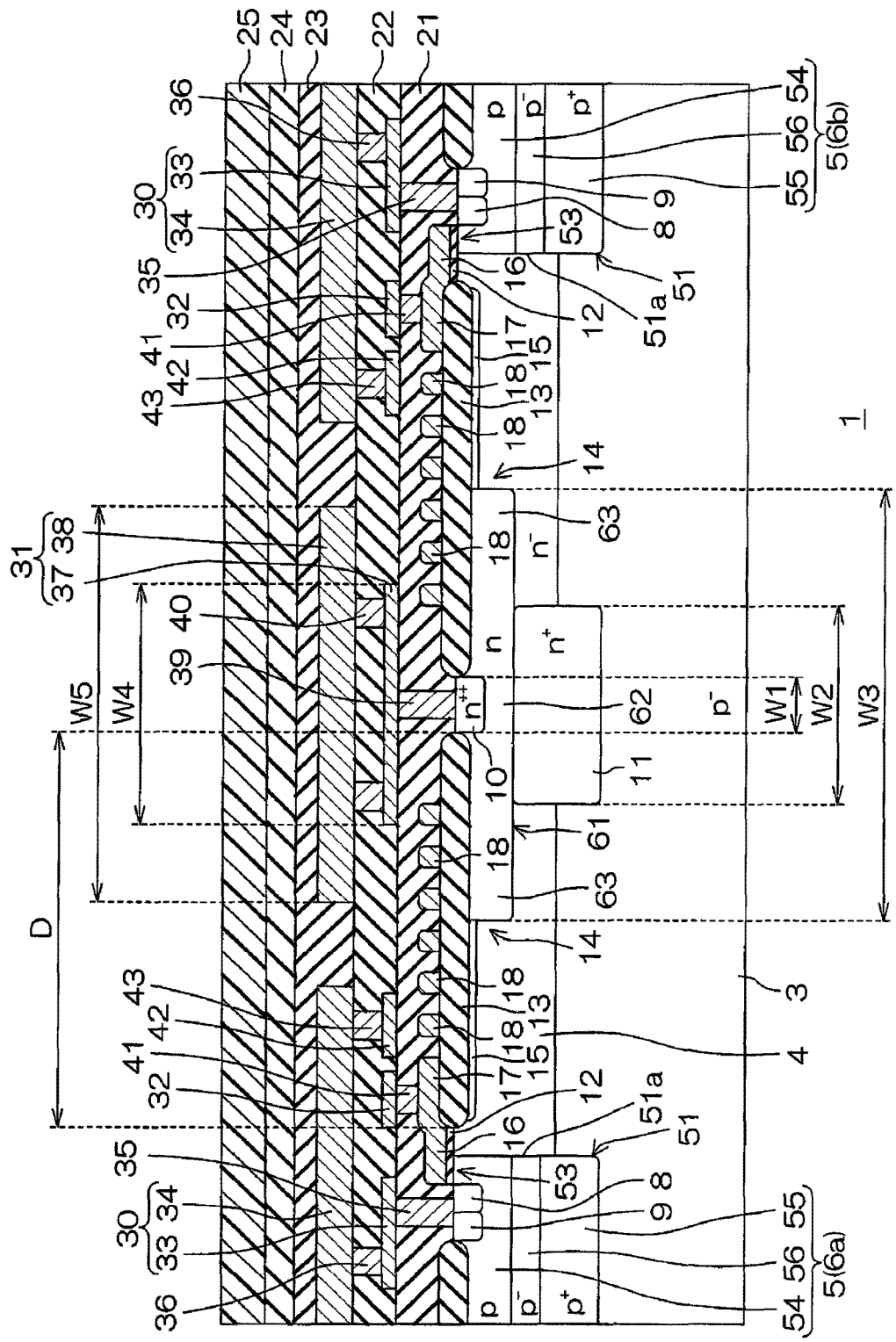
FIG. 3 is a longitudinal sectional view taken along line of FIG. 1.
Figure 4:
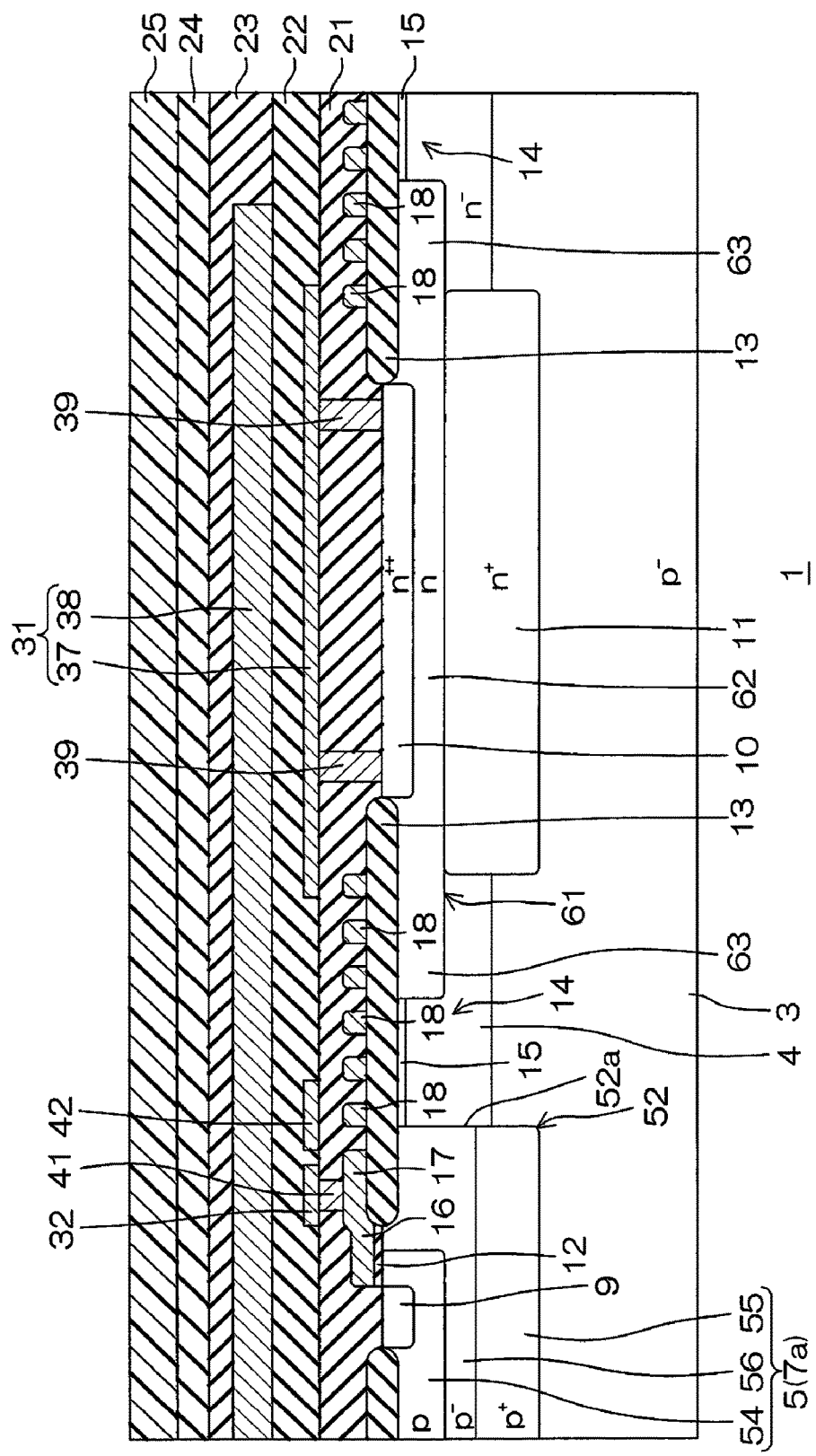
FIG. 4 is a longitudinal sectional view taken along line IV-IV of FIG. 1.

FIG. 1 is a plan view of a semiconductor device 1 according to a first embodiment of the present disclosure. FIG. 2 is a plan view of the semiconductor device 1 of FIG. 1, illustrating a configuration in which components on an epitaxial layer 4 are removed. FIG. 3 is a longitudinal sectional view taken along line of FIG. 1. FIG. 4 is a longitudinal sectional view taken along line IV-IV of FIG. 1.

The semiconductor device 1 is a semiconductor device including a laterally diffused metal insulator semiconductor (LDMIS) region 2 where an LDMIS having a drain-source voltage $V_{DS}$ of, for example, 500 to 1500 V, is formed. The semiconductor device 1 includes a p-type (first conductivity type) semiconductor substrate 3 and an epitaxial layer 4, which is formed on the semiconductor substrate 3, as an example of an n-type (second conductivity type) semiconductor layer. The semiconductor substrate 3 is, for example, a high resistance silicon substrate whose p-type impurity concentration is set to a relatively low value.

The p-type impurity concentration of the semiconductor substrate 3 is, for example, $1.0 \times 10^{13}$ cm$^{-3}$ to $1.0 \times 10^{14}$ cm$^{-3}$. The n-type impurity concentration of the epitaxial layer 4 is, for example, $1.0 \times 10^{15}$ cm$^{-3}$ to $1.0 \times 10^{16}$ cm$^{-3}$. The thickness of the epitaxial layer 4 is, for example, 1 to 10 μm. A p-type body region 5 is formed in a surface region of the epitaxial layer 4.

In this embodiment, the body region 5 is formed in an oval annular shape having a pair of band-like linear portions 6a and 6b parallel to each other in a plan view and a pair of band-like curved portions 7a and 7b respectively connected to both ends of the pair of linear portions 6a and 6b. By this annular body region 5, the LDMIS region 2 and another region are partitioned. A specific configuration of the body region 5 will be described later. In the surface region of the body region 5, an n-type source region 8, and a p-type body contact region 9 are formed to be adjacent to each other.

A plurality of source regions 8 (two source regions in this embodiment) are formed in the surface region of the body region 5 so as to be spaced apart from an inner periphery of the body region 5. The source regions 8 are formed in a linear shape in the linear portions 6a and 6b of the body region 5, respectively. The source region 8 has an n-type impurity concentration higher than that of the epitaxial layer 4. The n-type impurity concentration of the source region 8 is, for example, $1.0 \times 10^{19}$ cm$^{-3}$ to $1.0 \times 10^{20}$ cm$^{-3}$.

The body contact region 9 is formed in an oval shape along the body region 5 in the plan view. In the respective linear portions 6a and 6b of the body region 5, the body contact region 9 is disposed on a more outer peripheral side of the body region 5 than the source region 8. The body contact region 9 has a p-type impurity concentration higher than that of the body region 5. The p-type impurity concentration of the body contact region 9 is, for example, $1.0 \times 10^{19}$ cm$^{-3}$ to $1.0 \times 10^{20}$ cm$^{-3}$. An n-type drain region 10 is formed at the center of a region surrounded by the body region 5 in the surface region of the epitaxial layer 4 with a space from the body region 5.

The drain region 10 is installed in a linear shape in the plan view (an oval shape in the plan view in this embodiment) along the linear portions 6a and 6b at the central portion in the opposing direction of the pair of linear portions 6a and 6b of the body region 5. Thus, the source region 8 and the drain region 10 are formed to be spaced apart from each other in the surface region of the epitaxial layer 4. The drain region 10 has an n-type impurity concentration substantially equal to that of the source region 8. An n-type drain buffer region 11 is formed in the epitaxial layer 4 directly under the drain region 10.

The drain buffer region 11 is formed in the semiconductor substrate 3 and in the epitaxial layer 4 so as to cross a boundary between the semiconductor substrate 3 and the epitaxial layer 4, and forms a p-n junction with the semiconductor substrate 3. A withstand voltage of the semiconductor device 1 is increased by forming a p-n junction portion between the drain buffer region 11 and the semiconductor substrate 3. The drain buffer region 11 is formed in a linear shape in the plan view (an oval shape in the plan view in this embodiment) with a space from the body region 5 so as to extend along the drain region 10. Further, the drain buffer region 11 is formed to have its periphery extending to the outside (toward the source region 8) of the periphery of the drain region 10.

An upper portion of the drain buffer region 11 faces the entire bottom portion of the drain region 10 in a thickness direction of the epitaxial layer 4. The drain buffer region 11 has an n-type impurity concentration which is higher than that of the epitaxial layer 4 and lower than that of the drain region 10. The n-type impurity concentration of the drain buffer region 11 is, for example, $1.0 \times 10^{17}$cm$^{-3}$ to $1.0 \times 10^{18}$cm$^{-3}$.

A gate insulating film 12 is formed on the surface of the epitaxial layer 4. The gate insulating film 12 is formed in an annular shape in the plan view so as to be in contact with the body region 5 between the source region 8 and the drain region 10. The gate insulating film 12 is formed so as to cross an inner periphery of the body region 5 from a periphery of the side of the drain region 10 of the source region 8 and from a periphery of the side of the drain region 10 of the body contact region 9. The gate insulating film 12 may be a nitride film (SiN film), a silicon oxide film (SiO$_2$ film), or a laminated film of a nitride film and a silicon oxide film. In this embodiment, the gate insulating film 12 is a silicon oxide film.

A LOCOS film 13 is further formed on the surface of the epitaxial layer 4. The LOCOS film 13 is formed in an annular shape so as to cover a region between the source region 8 and the drain region 10 on the surface of the epitaxial layer 4 in the plan view. An outer periphery of the LOCOS film 13 is integrated with the gate insulating film 12, and an inner periphery of the LOCOS film 13 surrounds the drain region 10. The outer periphery of the LOCOS film 13 is positioned closer to the side of the drain region 10 than the inner periphery of the body region 5.

A region from the inner periphery to the outer periphery of the LOCOS film 13 is a drift region 14, and a distance D of this drift region 14 is, for example, 80 to 200 μm (about 120 μm in this embodiment). The LOCOS film 13 has a thickness greater than that of the gate insulating film 12. The thickness of the gate insulating film 12 is, for example, 300 to 1,000□ (about 500□ in this embodiment), and the thickness of the LOCOS film 13 is not less than 10 times that of the gate insulating film 12, for example, 5,000 to 15,000□ (about 8,000□ in this embodiment).

A p-type resurf layer 15 is formed in a portion of the epitaxial layer 4 in contact with the LOCOS film 13. The resurf layer 15 is formed in an annular shape along the LOCOS film and forms a p-n junction with the epitaxial layer 4. The resurf layer 15 has a p-type impurity concentration higher than that of the semiconductor substrate 3. The p-type impurity concentration of the resurf layer 15 is, for example, $1.0 \times 10^{15}$ cm$^{-3}$ to $1.0 \times 10^{16}$ cm$^{-3}$.

A gate electrode 16 is formed on the gate insulating film 12. The gate electrode 16 faces the body region 5 via the gate insulating film 12 between the source region 8 and the drain region 10. The gate electrode 16 has a coating portion 17 which continuously extends from the gate insulating film 12 to the outer periphery of the LOCOS film 13 and covers the outer periphery of the LOCOS film 13. The gate electrode 16 is made of, for example, polysilicon doped with impurities.

A plurality of field plates 18 (six field plates in this embodiment) in an electrically floating state are disposed to be spaced apart from each other on the LOCOS film 13. That is, the field plates 18 are electrically insulated from any of the source region 8, the drain region 10, and the gate electrode 16. The field plates 18 are installed to suppress disturbance of an electric field in the epitaxial layer 4. The field plates 18 are disposed such that the field plates 18 having a relatively long circumferential length surround the field plates 18 having a relatively short circumferential length. The field plats 18 are formed of the same material as that of the gate electrode 16 and have the same thickness as that of the gate electrode 16.

A plurality of interlayer insulating films are formed on the epitaxial layer 4 so as to cover the LOCOS film 13, the gate electrode 16, and the field plates 18. The interlayer insulating films include a first interlayer insulating film 21, a second interlayer insulating film 22, and a third interlayer insulating film 23. The first interlayer insulating film 21, the second interlayer insulating film 22, and the third interlayer insulating film 23 have a monolayer structure of, for example, silicon oxide (SiO$_2$) or silicon nitride (SiN). A passivation film 24 made of, for example, silicon nitride (SiN), and a resin film 25 made of, for example, a polyimide resin, are formed on the third interlayer insulating film 23.

A source metal 30 electrically connected to the source region 8, a drain metal 31 electrically connected to the drain region 10, and a gate metal 32 electrically connected to the gate electrode 16 are disposed in the interlayer insulating films.

In this embodiment, the source metal 30 has a laminated structure including a first source metal 33 formed on the source region 8 and a second source metal 34 formed on the first source metal 33.

The first source metal 33 is disposed on the first interlayer insulating film 21 and formed in a linear shape so as to cover the entire source region 8. The first source metal 33 is electrically connected to the source region 8 and the body contact region 9 via a contact 35 formed in the first interlayer insulating film 21.

The second source metal 34 is disposed on the second interlayer insulating film 22. As illustrated in FIG. 1, the second source metal 34 is formed in a concave shape in the plan view so as to expose a region of the second interlayer insulating film 22 on the drain region 10. More specifically, the second source metal 34 includes a pair of first portions 34a and 34b formed along the pair of linear portions 6a and 6b of the body region 5 and a connection portion 34c which is formed along a curved portion 7b of the body region 5 on the other side and connects the pair of first portions 34a and 34b. The second source metal 34 is electrically connected to the first source metal 33 via a contact 36 formed in the second interlayer insulating film 22.

The drain metal 31 is formed on the drain region 10 in the plan view. In this embodiment, the drain metal 31 has a laminated structure including a first drain metal 37 formed on the drain region 10 and a second drain metal 38 formed on the first drain metal 37.

The first drain metal 37 is disposed on the first interlayer insulating film 21 and is formed in a linear shape in the plan view (for example, an oval shape in the plan view) so as to cover the entire drain region 10. The first drain metal 37 is configured such that its periphery extends to the outside of the periphery of the drain buffer region 11 in the plan view. The first drain metal 37 faces an innermost field plate 18 among the field plates 18 disposed on the LOCOS film 13, with the first interlayer insulating film 21 interposed therebetween. That is, the first drain metal 37 is capacitively coupled to the innermost field plate 18 via the first interlayer insulating film 21. The first drain metal 37 is electrically connected to the drain region 10 via a contact 39 formed in the first interlayer insulating film 21.

The second drain metal 38 is disposed on the second interlayer insulating film 22. As illustrated in FIG. 1, the second drain metal 38 is formed in a convex shape in the plan view so as to be engaged with a concave portion in the plan view which is partitioned by the second source metal 34. More specifically, the second drain metal 38 is formed in a linear shape so as to cross the curved portion 7a of one side of the body region 5 from the outside of the LDMIS region 2 and cover the drain region 10 in the plan view. A front end portion of the second drain metal 38 disposed in the concave portion in the plan view which is partitioned by the second source metal 34, is formed in a circular arc shape toward the outside.

The second drain metal 38 is configured such that its periphery extends to the outside of the periphery of the first drain metal 37, and covers the entire first drain metal 37. The second drain metal 38 faces some of the field plates 18 formed on the LOCOS film 13 in the plan view. In this embodiment, the second drain metal 38 faces three field plates 18 counting from the innermost side in the plan view. The second drain metal 38 is electrically connected to the drain region 10 via a contact 40 formed in the second interlayer insulating film 22.

The gate metal 32 has a monolayer structure and is disposed on the first interlayer insulating film 21. The gate metal 32 is formed in an annular shape along the gate electrode 16 so as to cover the gate electrode 16. The gate metal 32 is electrically connected to the gate electrode 16 via a contact 41.

A field metal 42 for suppressing disturbance of an electric field or the like in the epitaxial layer 4 is further disposed on the first interlayer insulating film 21. The field metal 42 is formed in an annular shape in the plan view along an inner periphery of the gate metal 32. The field metal 42 faces an outermost field plate 18 among the field plates 18 disposed on the LOCOS film 13, with the first interlayer insulating film 21 interposed therebetween. That is, the field metal 42 is capacitively coupled to the outermost field plate 18 via the first interlayer insulating film 21. The field metal 42 is electrically connected to the second source metal 34 via a contact 43 formed in the second interlayer insulating film 22.

Referring again to FIGS. 1 to 4, a configuration of the body region 5 will be described in detail. The body region 5 includes a first body portion 51 where a p-n junction portion 51a with the epitaxial layer 4 is in contact with the gate insulating film 12 and a second body portion 52 where a p-n junction portion 52a with the epitaxial layer 4 is in contact with the LOCOS film 13.

The first body portion 51 of the body region 5 is formed in a portion along the pair of linear portions 6a and 6b. In the first body portion 51, a channel 53 is formed in a portion in which the gate electrode 16 faces via the gate insulating film 12. Thus, the first body portion 51 forms a current path with the epitaxial layer 4 by formation of the channel 53.

On the other hand, the second body portion 52 of the body region 5 is formed in a band shape in a portion along the pair of curved portions 7a and 7b, and is formed as a protrusion portion that protrudes to the side of the drain region 10 from the first body portion 51. The second body portion 52 faces the coating portion 17 of the gate electrode 16 with the LOCOS film 13 interposed therebetween. The p-n junction portion 52a of the second body portion 52 is positioned between the gate insulating film 12 and an end portion of the side of the drain region 10 in the gate electrode 16. In this embodiment, since the second body portion 52 is formed in a portion in which the source region 8 is not present, the second body portion 52 does not form a current path with the epitaxial layer 4.

The body region 5 is formed with different p-type impurity concentrations with respect to a thickness direction from a surface region toward a bottom portion of the body region 5. More specifically, the body region 5 is formed such that the p-type impurity concentration of a middle portion in the thickness direction is the lowest. The body region 5 includes a p-type first high concentration region 54 formed on a surface side, a $p^+$-type second high concentration region 55 formed on a bottom side and having an impurity concentration higher than that of the first high concentration region 54, and a $p^-$-type low concentration region 56 interposed between the first high concentration region 54 and the second high concentration region 55 and having a p-type impurity concentration lower than that of the first high concentration region 54.

The p-type impurity concentration of the first high concentration region 54 is, for example, $1.0\times10^{17}$ cm$^{-3}$ to $1.0\times10^{18}$ cm$^{-3}$. The p-type impurity concentration of the second high concentration region 55 is, for example, $1.0\times10^{18}$ cm$^{-3}$ to $1.0\times10^{19}$ cm$^{-3}$. The p-type impurity concentration of the low concentration region 56 is, for example, $1.0\times10^{16}$ cm$^{-3}$ to $1.0\times10^{17}$ cm$^{-3}$.

The first high concentration region 54 and the low concentration region 56 are installed to form a p-n junction portion with the epitaxial layer 4. On the other hand, the second high concentration region 55 is formed so as to cross the boundary between the semiconductor substrate 3 and the epitaxial layer 4 with respect to the thickness direction of the body region 5 and is installed to form a p-n junction portion with a portion of the epitaxial layer 4.

The first body portion 51 of the body region 5 and the second body portion 52 of the body region 5 are formed with different impurity concentrations. More specifically, the first body portion 51 includes the first high concentration region 54, the second high concentration region 55, and the low concentration region 56. In the first body portion 51, the first high concentration region 54, the second high concentration region 55, and the low concentration region 56 form the p-n junction portion 51a with the epitaxial layer 4.

On the other hand, the second body portion 52 includes the second high concentration region 55 and the low concentration region 56. In the second body portion 52, the second high concentration region 55 and the low concentration region 56 form the p-n junction portion 52a with the epitaxial layer 4. The low concentration region 56 of the second body portion 52 is formed between the first high concentration region 54 and the second high concentration region 55 to contact the surface region of the epitaxial layer 4 on the side of the drain region 10. The second high concentration region 55 of the second body portion 52 extends to the side of the drain region 10 while maintaining its depth so as to be in contact with a bottom portion of the low concentration region 56.

Since the p-n junction portion 52a of the second body portion 52 is disposed closer to the side of the drain region 10 than the p-n junction portion 51a of the first body portion 51, an electric field higher than that applied to the p-n junction portion 51a of the first body portion 51 is applied thereto. That is, the electric field strength applied to the p-n junction portion 51a of the first body portion 51 is relatively reduced by the second body portion 52.

Therefore, when a high voltage such as an overvoltage is applied between the drain region 10 and the source region 8, its load concentrates on the second body portion 52 to more preferentially break down the second body portion 52 excluding the channel 53 than the first body portion 51. Thus, it is possible to concentrate a high electric field or hot carrier generated by the breakdown on the second body portion 52. As a result, since the breakdown in the first body portion 51 can be effectively avoided or suppressed, it is possible to effectively suppress the gate insulating film 12 in contact with the first body portion 51 from being damaged.

Further, since the breakdown occurs in the second body portions 52, it is possible to distribute the load due to the breakdown to the second body portions 52. Thus, since the load per the second body portion 52 can be reduced, it is possible to effectively suppress a fluctuation in characteristics caused by the damage to the gate insulating film 12 due to the breakdown, while effectively avoiding or suppressing an occurrence of a breakdown in the first body portion 51.

Referring to FIGS. 1 to 4, the semiconductor device 1 is characterized in that it includes an n-type well region 61 formed in a predetermined shape in the epitaxial layer 4 between the drain region 10 and the drain buffer region 11.

In this embodiment, the well region 61 is intended to suppress an occurrence of an electric field concentration between the source region 8 and the drain region 10 in the epitaxial layer 4. Hereinafter, a configuration of the well region 61 and its surroundings will be described in more detail.

As illustrated in FIGS. 1 to 4, the well region 61 is formed between the drain region 10 and the drain buffer region 11 so as to be in contact therewith. That is, the drain region 10, the drain buffer region 11, and the well region 61 are electrically connected. The well region 61 is formed so as to be in contact with the LOCOS film 13, and the boundary between the well region 61 and the epitaxial layer 4 is in contact with the LOCOS film 13.

The well region 61 has an n-type impurity concentration which is higher than that of the epitaxial layer 4 and lower than that of the drain buffer region 11. The n-type impurity concentration of the well region 61 is, for example, $1.0 \times 10^{16}$ cm$^{-3}$ to $1.0 \times 10^{17}$ cm$^{-3}$. Further, the well region 61 may be formed to be spaced apart from each other between the drain region 10 and the drain buffer region 11. In this case, the drain region 10, the drain buffer region 11, and the well region 61 are electrically connected via the epitaxial layer 4. In addition, the well region 61 may be formed to be spaced apart from the LOCOS film 13.

The well region 61 is formed in a linear shape in the plan view (an oval shape in the plan view in this embodiment) so as to extend along the drain region 10 and the drain buffer region 11 with a space from the body region 5. The well region 61 is formed to have its periphery extending to the outside (toward the side of source region 8) of the periphery of the drain buffer region 11. More specifically, the well region 61 has a facing portion 62 facing the drain region 10 and a lead-out portion 63 extending from the facing portion 62 toward the source region 8.

As described above, the periphery of the drain buffer region 11 extends to the outside of the periphery of the drain region 10. With respect to the drain buffer region 11, the periphery of the lead-out portion 63 of the well region 61 extends to the outside of the periphery of the drain buffer region 11 in the plan view. Thus, the drain buffer region 11 is formed to be contained inside the well region 61 in the plan view, and the entire upper portion of the drain buffer region 11 is formed to face a bottom portion of the well region 61 in the thickness direction of the epitaxial layer 4. When a direction perpendicular to a formation direction of the linear drain region 10 is defined as a transverse direction, a relational expression of $W1<W2<W3$ is established among a width $W1$ of the drain region 10 in the traverse direction, a width $W2$ of the drain buffer region 11 in the traverse direction, and a width $W3$ of the well region 61 in the traverse direction.

The drain metal 31 is formed to overlap the well region 61 in the plan view. Further, the periphery of the lead-out portion 63 of the well region 61 extends to the outside of the periphery of the drain metal 31 (the periphery of the first drain metal 37 and the periphery of the second drain metal 38) in the plan view. As described above, in this embodiment, it is configured such that the periphery of the first drain metal 37 extends to the outside of the periphery of the drain buffer region 11, and the periphery of the second drain metal 38 extends to the outside of the periphery of the first drain metal 37. Thus, a relational expression of $W2<W4<W5<W3$ is established among a width $W2$ of the drain buffer region 11 in the traverse direction, a width $W3$ of the well region 61 in the traverse direction, a width $W4$ of the first drain metal 37 in the traverse direction, and a width $W5$ of the second drain metal 38 in the traverse direction.

Further, the lead-out portion 63 of the well region 61 is formed to overlap some of the field plates 18 (three field plates 18 counting from the innermost side in this embodiment).

Figure 5:
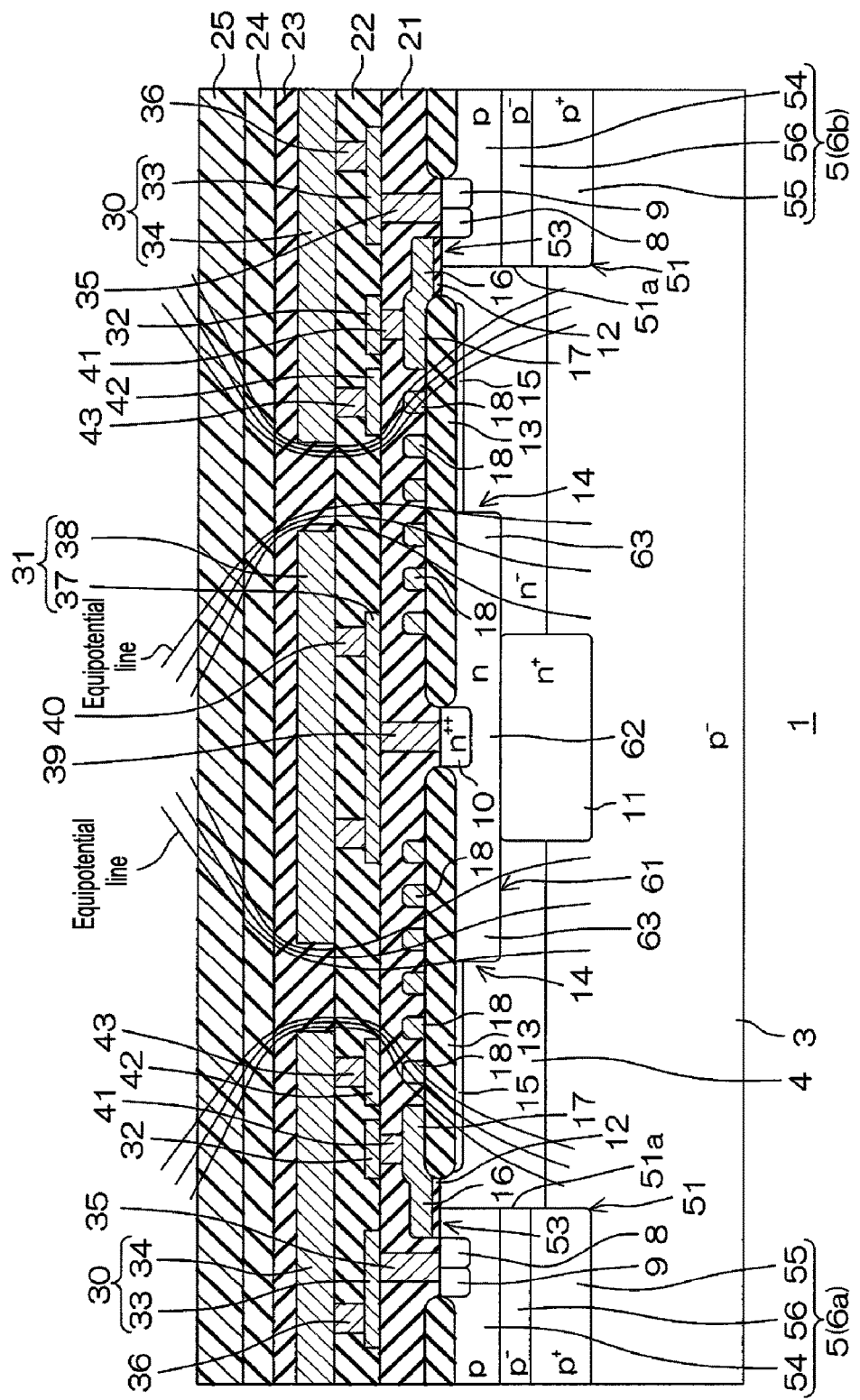
FIG. 5 is a longitudinal sectional view corresponding to FIG. 3 that shows equipotential lines of the semiconductor device according to the first embodiment of the present disclosure.
Figure 6:
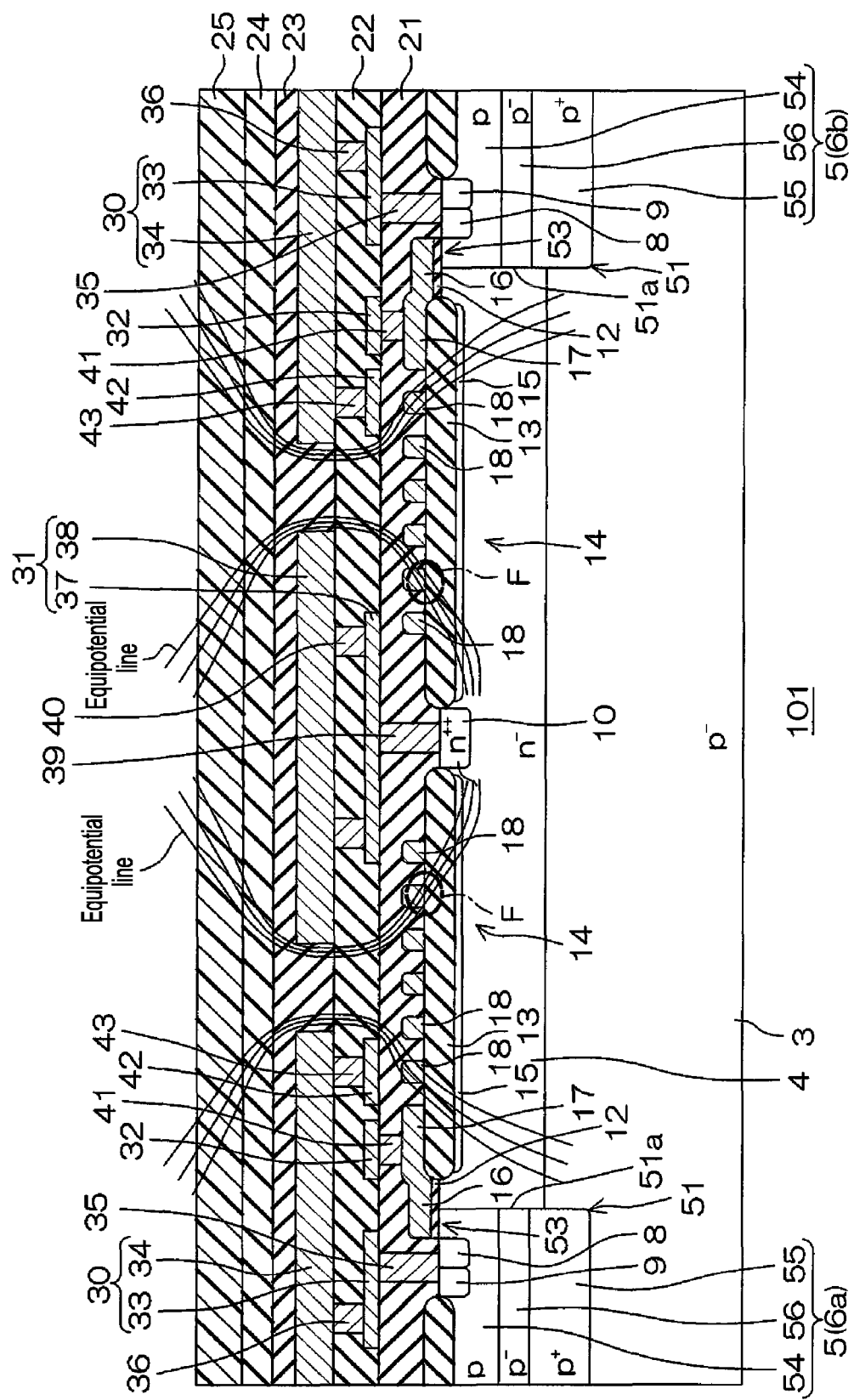
FIG. 6 is a longitudinal sectional view of a semiconductor device according to a reference example.

Hereinafter, the effects of the semiconductor device 1 according to this embodiment will be described with reference to FIGS. 5 and 6. FIG. 5 is a longitudinal sectional view corresponding to FIG. 3 that shows equipotential lines of the semiconductor device 1 according to the first embodiment of the present disclosure. FIG. 6 is a longitudinal sectional view of a semiconductor device 101 according to a reference example. The semiconductor device 101 according to the reference example has substantially the same components as those of the semiconductor device 1 according to this embodiment, except that it does not include the drain buffer region 11 and the well region 61. In FIG. 6, the same components as those illustrated in FIGS. 1 to 5 will be denoted by the same reference numerals and descriptions thereof will be omitted.

As illustrated in FIG. 6, in the semiconductor device 101 according to the reference example, there is a possibility that equipotential lines extending from the drain metal 31 are sharply bent toward the drain region 10 near the surface of the epitaxial layer 4 and a region where spaces between the equipotential lines are narrow, i.e., a region F where the equipotential lines are dense, may occur. The region F where the equipotential lines are dense is a region where the electric field strength is higher than those of other regions and the electric field is locally concentrated. Such a local electric field concentration has a problem that it causes a reduction in withstand voltage of the semiconductor device.

On the other hand, the semiconductor device 1 according to this embodiment includes the drain buffer region 11 whose periphery extends to the outside of the periphery of the drain region 10 and is configured such that the periphery of the lead-out portion 63 of the well region 61 extends to the outside of the periphery of the drain buffer region 11 in the plan view.

According to the drain buffer region 11 as described above, as illustrated in FIG. 5, it is possible to suppress the equipotential lines extending from the drain metal 31 from being bent toward the drain region 10 in the proximity of the surface of the epitaxial layer 4. In addition, since the periphery of the lead-out portion 63 of the well region 61 disposed above the drain buffer region 11 extends to the outside of the periphery of the drain buffer region 11 in the plan view, it is possible to advantageously suppress the equipotential lines extending from the drain metal 31 from being bent toward the drain region 10 near the surface of the epitaxial layer 4. As a result, it is possible to advantageously suppress occurrence of local electric field concentration between the drain region 10 and the source region 8.

Further, in the semiconductor device 1 according to this embodiment, the periphery of the lead-out portion 63 of the well region 61 extends to the outside of the periphery of the drain metal 31 (the periphery of the first drain metal 37 and the periphery of the second drain metal 38) in the plan view. By the lead-out portion 63 of the well region 61 extending to the side of the drain region 10, it is possible to effectively suppress the equipotential lines extending from the drain metal 31 from being bent toward the drain region 10 near the surface of the epitaxial layer 4. As a result, it is possible to effectively suppress occurrence of local electric field concentration between the drain region 10 and the source region 8.

Furthermore, in addition to the above, in the semiconductor device 1 according to this embodiment, the lead-out portion 63 of the well region 61 overlaps some of the field plates 18 in the plan view. According to the field plates 18, it is possible to allow the equipotential lines extending from the drain metal 31 to suppress disturbance near the surface of the epitaxial layer 4. That is, it is possible to suppress disturbance of an electric field in the epitaxial layer 4 by the field plates 18. Thus, by disposing the lead-out portion 63 of the well region 61 in a region where disturbance of an electric field in the epitaxial layer 4 is suppressed, it is possible to more effectively suppress an occurrence of a local electric field concentration between the drain region 10 and the source region 8.

As mentioned above, according to this embodiment, since the occurrence of the local electric field concentration between the drain region 10 and the source region 8 can be effectively suppressed, it is possible to provide the semiconductor device 1 that can effectively improve a withstand voltage.

Further, in the configuration in which the resin film 25 is installed, negative ions in the resin film 25 become movable ions so that they move from between the source metal 30 and the drain metal 31 to a region on the LOCOS film 13 or to a region on the surface of the epitaxial layer 4. As a result, in some cases, the equipotential lines may fluctuate so that the electric field distribution of the epitaxial layer 4 may change. With the configuration of this embodiment, since the lead-out portion 63 of the well region 61 is disposed in the region between the source metal 30 and the drain metal 31, it is also to suppress a change in the field distribution of the epitaxial layer due to the movable ions. Thus, the configuration in which the lead-out portion 63 of the well region 61 is disposed in the region between the source metal 30 and the drain metal 31 is effective in suppressing an occurrence of a local electric field concentration caused by the movable ions.

Figure 7:
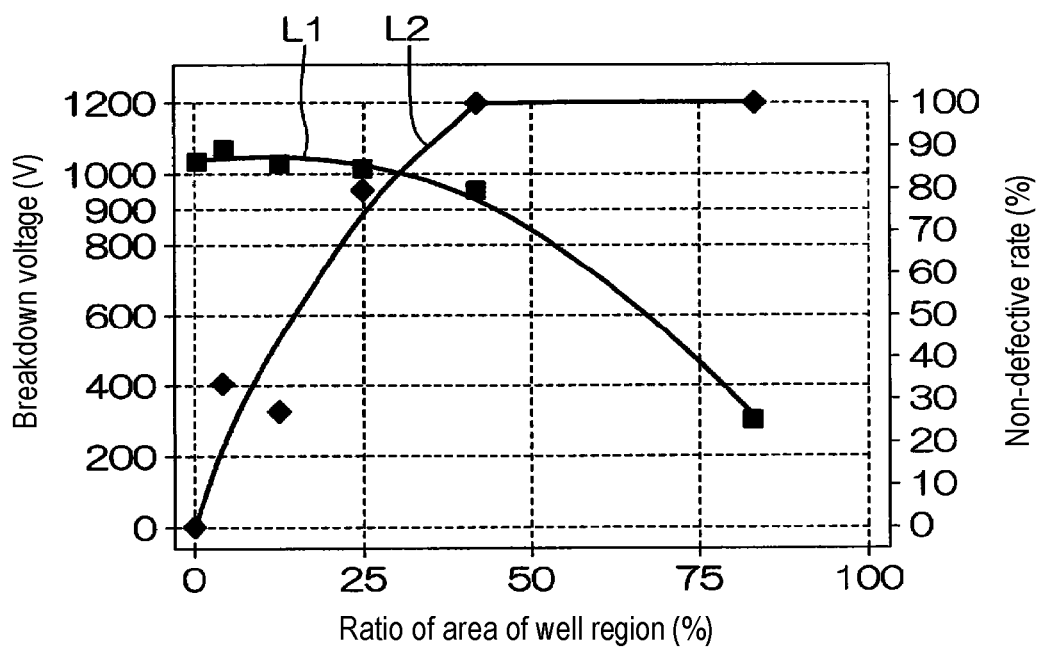
FIG. 7 is a graph illustrating a change in a withstand voltage of a semiconductor device when a ratio of an area of a well region to an overall area of a drift region is changed.

Next, the withstand voltage of the semiconductor device 1 will be described with reference to FIG. 7. FIG. 7 is a graph that shows a change in a withstand voltage of the semiconductor device 1 when a ratio of an area of the well region 61 to an overall area of the drift region 14 is changed. The overall area of the drift region 14 is also an overall area of a region from the inner periphery to the outer periphery of the LOCOS film 13.

In this embodiment, a plurality of semiconductor devices 1 in which the ratio of area of the well region 61 to the overall area of the drift region 14 is changed were prepared as test samples, and a breakdown voltage BV and a non-defective rate R at the time of performing an electrostatic breakdown test were measured.

The breakdown voltage BV is a voltage at which the semiconductor device 1 is damaged, and is measured by increasing a drain voltage $V_D$ from 0 V to the voltage at which the semiconductor device 1 is damaged when a source voltage $V_S$ is 0 V and a gate voltage $V_G$ is 0 V.

In this embodiment, the electrostatic breakdown test is a human body model (HBM) test by which electrostatic breakdown withstand capability of the semiconductor device 1 when a charged human body comes into contact with the semiconductor device 1 as a test sample is measured. The non-defective rate R represents a proportion of the number of the semiconductor devices 1 having electrostatic breakdown withstand capability equal to or greater than a predetermined value, among all the semiconductor devices 1 as the test samples. Further, in this embodiment, the electrostatic breakdown withstand capability of the semiconductor device 1 is measured by applying a voltage of about −2000 V between a source and a drain a plurality of times after applying a voltage of about +2000 V between the source and the drain a plurality of times.

In FIG. 7, the horizontal axis is a percentage (%) of an area of the well region 61 to the overall area of the drift region 14; the left vertical axis represents a breakdown voltage BV(V) between the source and the drain representing a withstand voltage of the semiconductor device 1; and the right vertical axis is a non-defective rate R (%) when the electrostatic breakdown test was performed. In the graph of FIG. 7, the curve L1 and the curve L2 are shown. The curve L1 denotes a change in the breakdown voltage BV and the curve L2 denotes a change in the non-defective rate R when the electrostatic breakdown test was performed.

Referring to the curve L1, it is understood that as the ratio of the area of the well region 61 to the overall area of the drift region 14 increases, the breakdown voltage BV decreases. This is considered to be because, as the area of the well region 61 increases, the spreading of a depletion layer that should be originally spread in the p-n junction portion of the p-type body region 5 and the epitaxial layer 4 is hindered by the well region 61, resulting in an increase in electric field strength between the source and the drain.

On the other hand, referring to the curve L2, it is understood that as the ratio of the area of the well region 61 to the overall area of the drift region 14 increases, the non-defective rate R improves. This is considered to be because, as the area of the well region 61 increases, the current easily flows due to a decrease in resistance value of the drift region 14, and as a result, an overcurrent caused by an overvoltage easily moves out of the epitaxial layer 4.

Referring to the curve L1 and the curve L2, it is understood that, regarding the ratio of the area of the well region 61 to the overall area of the drift region 14, the breakdown voltage BV and the non-defective rate R are in a trade-off relationship. It is also understood that, if the ratio of the area of the well region 61 to the overall area of the drift region 14 is within a range of 25% to 50%, the breakdown voltage BV of 900 to 1,200 V can be achieved while achieving 70% or more of non-defective rate R.

Therefore, by further providing the characteristics that the ratio of the area of the well region 61 to the overall area of the drift region 14 is 25% to 50%, it is possible to improve the non-defective rate R, i.e., the electrostatic breakdown withstand capability, while improving the breakdown voltage BV.

<Second Embodiment>

Figure 8:
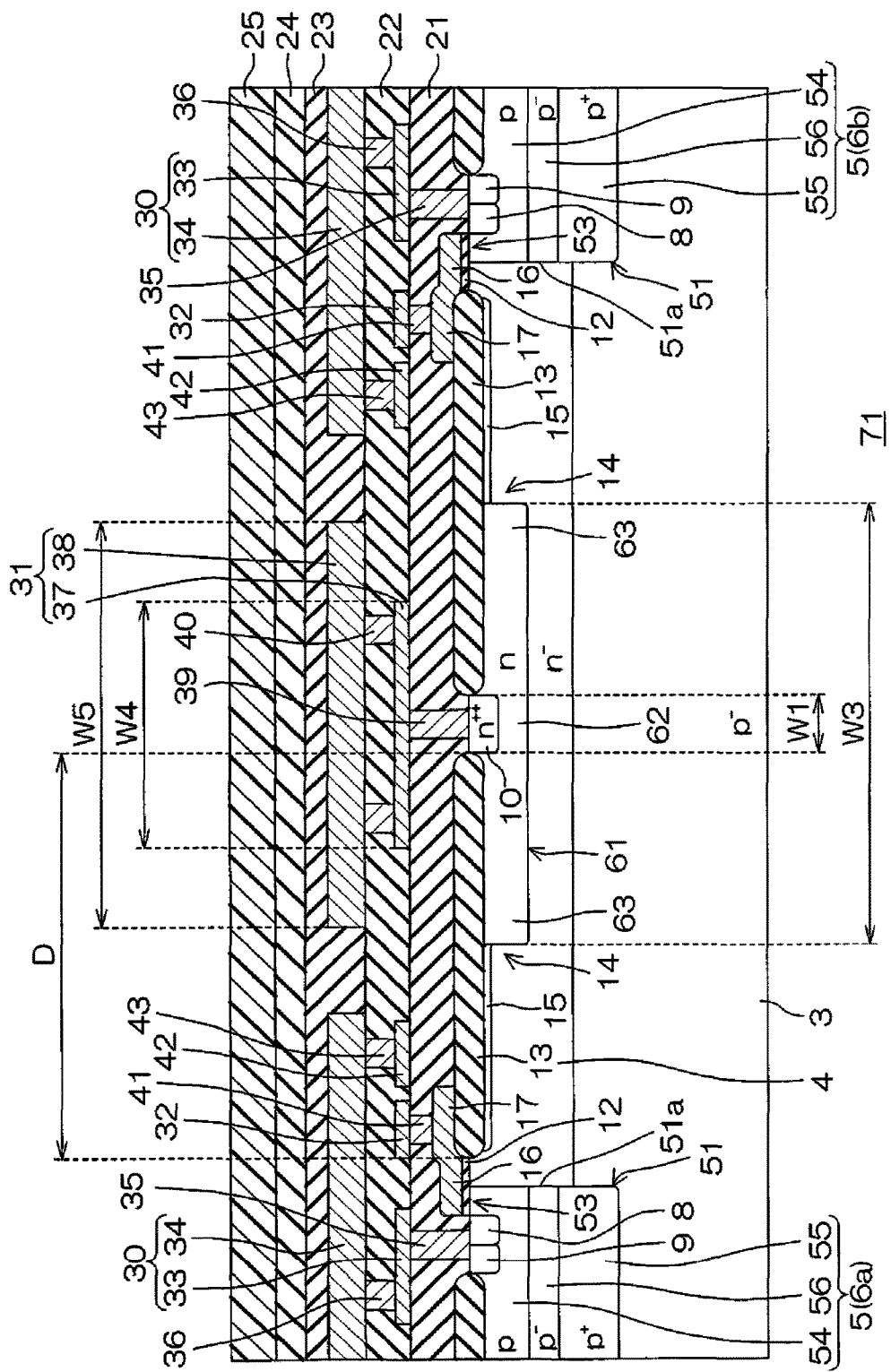
FIG. 8 is a longitudinal sectional view of a semiconductor device according to a second embodiment of the present disclosure.

FIG. 8 is a longitudinal sectional view of a semiconductor device 71 according to a second embodiment of the present disclosure. FIG. 8 is a longitudinal sectional view of a portion corresponding to FIG. 3 described above. The semiconductor device 71 according to the second embodiment has substantially the same components as those of the semiconductor device 1 according to the aforementioned first embodiment, except that it does not have the aforementioned drain buffer region 11 and the plurality of field plates 18. In FIG. 8, the same components as those described in the aforementioned first embodiment will be denoted by the same reference numerals and descriptions thereof will be omitted.

As illustrated in FIG. 8, the well region 61 is formed on the epitaxial layer 4 directly under the drain region 10. The well region 61 is formed in a linear shape in the plan view (an oval shape in the plan view in this embodiment) so as to extend along the drain region 10 with a space from the body region 5, and has a facing portion 62 facing the drain region 10 and a lead-out portion 63 extending from the facing portion 62 toward the source region 8.

The periphery of the lead-out portion 63 of the well region 61 extends to the outside of the periphery of the drain metal 31 (the periphery of the first drain metal 37 and the periphery of the second drain metal 38) in the plan view. Thus, a relational expression of W4<W5<W3 is established among a width W3 of the well region 61 in a traverse direction, a width W4 of the first drain metal 37 in the traverse direction, and a width W5 of the second drain metal 38 in the traverse direction.

Even with this configuration, it is possible to suppress the equipotential lines extending from the drain metal 31 from being bent toward the drain region 10 near the surface of the epitaxial layer 4 by the lead-out portion 63 of the well region 61 extending to the side of the drain region 10. Thus, since the occurrence of the local electric field concentration between the drain region 10 and the source region 8 can be suppressed, it is possible to provide the semiconductor device 71 that can be improve a withstand voltage.

<Third Embodiment>

Figure 9:
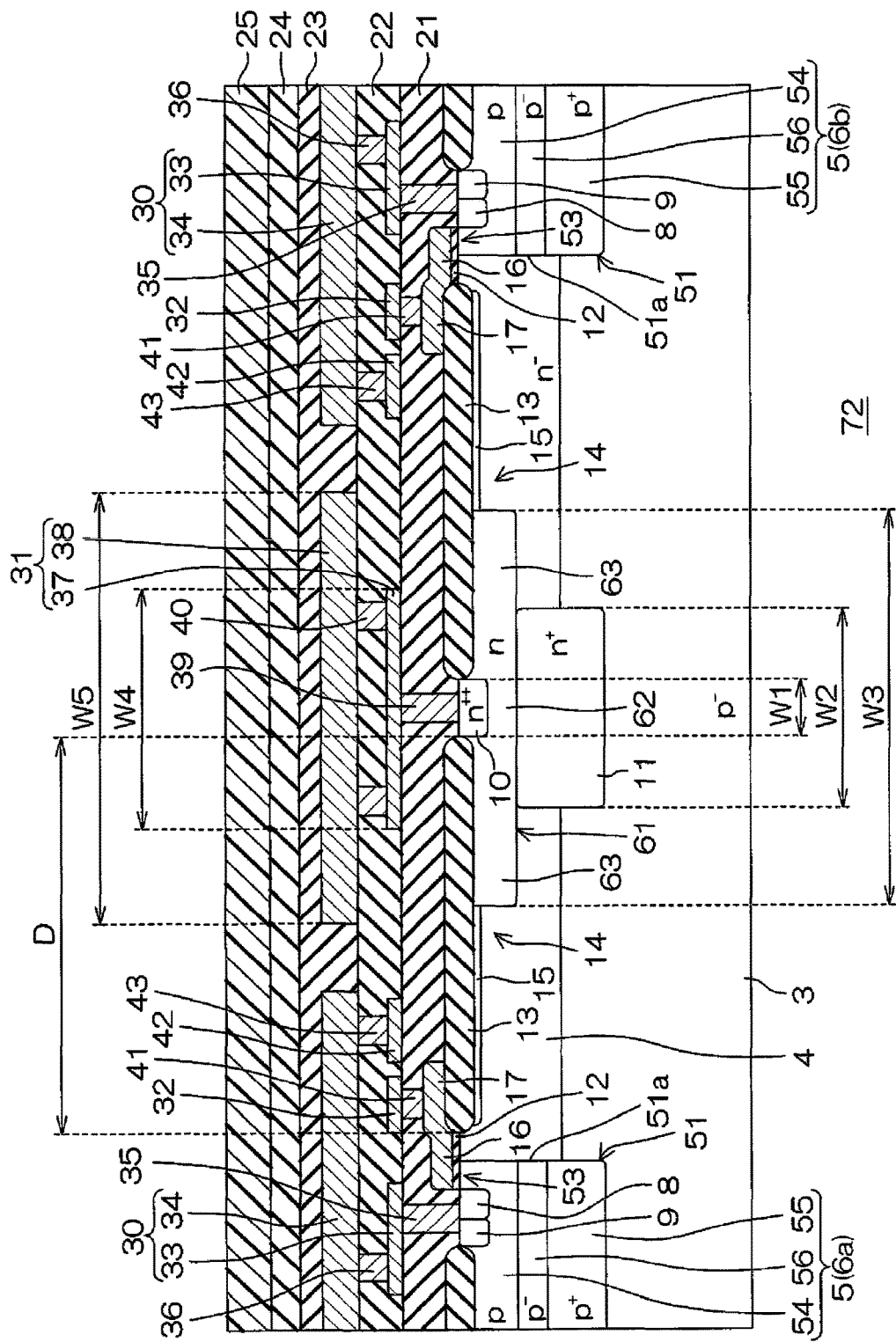
FIG. 9 is a longitudinal sectional view of a semiconductor device according to a third embodiment of the present disclosure.

FIG. 9 is a longitudinal sectional view of a semiconductor device 72 according to a third embodiment of the present disclosure. FIG. 9 is a longitudinal sectional view of a portion corresponding to FIG. 3 described above. The semiconductor device 72 according to the third embodiment has substantially the same components as those of the semiconductor device 1 according to the aforementioned first embodiment, except that it does not have the plurality of field plates 18 described above. In FIG. 9, the same components as those described in the aforementioned first embodiment will be denoted by the same reference numerals and descriptions thereof will be omitted.

As illustrated in FIG. 9, similar to the aforementioned first embodiment, the well region 61 is formed between the drain region 10 and the drain buffer region 11 so as to be in contact therewith, and has a facing portion 62 facing the drain region 10 and a lead-out portion 63 extending from the facing portion 62 toward the source region 8.

The periphery of the drain buffer region 11 extends to the outside of the periphery of the drain region 10 and the periphery of the lead-out portion 63 of the well region 61 extends to the outside of the periphery of the drain buffer region 11 in the plan view. Thus, a relational expression of W1<W2<W3 is established among a width W1 of the drain region 10 in a traverse direction, a width W2 of the drain buffer region 11 in the traverse direction, and a width W3 of the well region 61 in the traverse direction.

In this embodiment, the periphery of the lead-out portion 63 of the well region 61 extends to the outside of periphery of the first drain metal 37 in the plan view, while it is disposed on the inner side of the periphery of the second drain metal 38. Thus, a relational expression of W2<W4<W3<W5 is established among a width W2 of the drain buffer region 11 in a traverse direction, a width W3 of the well region 61 in the traverse direction, a width W4 of the first drain metal 37 in a traverse direction, and a width W5 of the second drain metal 38 in the traverse direction.

In this manner, the semiconductor device 72 according to this embodiment includes the drain buffer region 11 whose periphery extends to the outside of the periphery of the drain region 10, and it is configured such that the periphery of the lead-out portion 63 of the well region 61 extends to the outside of the periphery of the drain buffer region 11 in the plan view.

According to this drain buffer region 11, it is possible to suppress the equipotential lines extending from the drain metal 31 from being bent toward the drain region 10 near the surface of the epitaxial layer 4. In addition, since the periphery of the lead-out portion 63 of the well region 61 disposed above the drain buffer region 11 extends to the outside of the periphery of the drain buffer region 11 in the plan view, it is possible to advantageously suppress the equipotential lines extending from the drain metal 31 from being bent toward the drain region 10 near the surface of the epitaxial layer 4. As a result, since the occurrence of local electric field concentration between the drain region 10 and the source region 8 can be advantageously suppressed, it is possible to provide the semiconductor device 72 that can be improve a withstand voltage.

Even in this embodiment, it may be configured such that the periphery of the lead-out portion 63 of the well region 61 extends to the outside of the periphery of the first drain metal 37 in the plan view. That is, similar to the aforementioned first embodiment, a relational expression of W2<W4<W5<W3 is established among a width W2 of the drain buffer region 11 in a traverse direction, a width W3 of the well region 61 in the traverse direction, a width W4 of the first drain metal 37 in the traverse direction, and a width W5 of the second drain metal 38 in the traverse direction.

<Fourth Embodiment>

Figure 10:
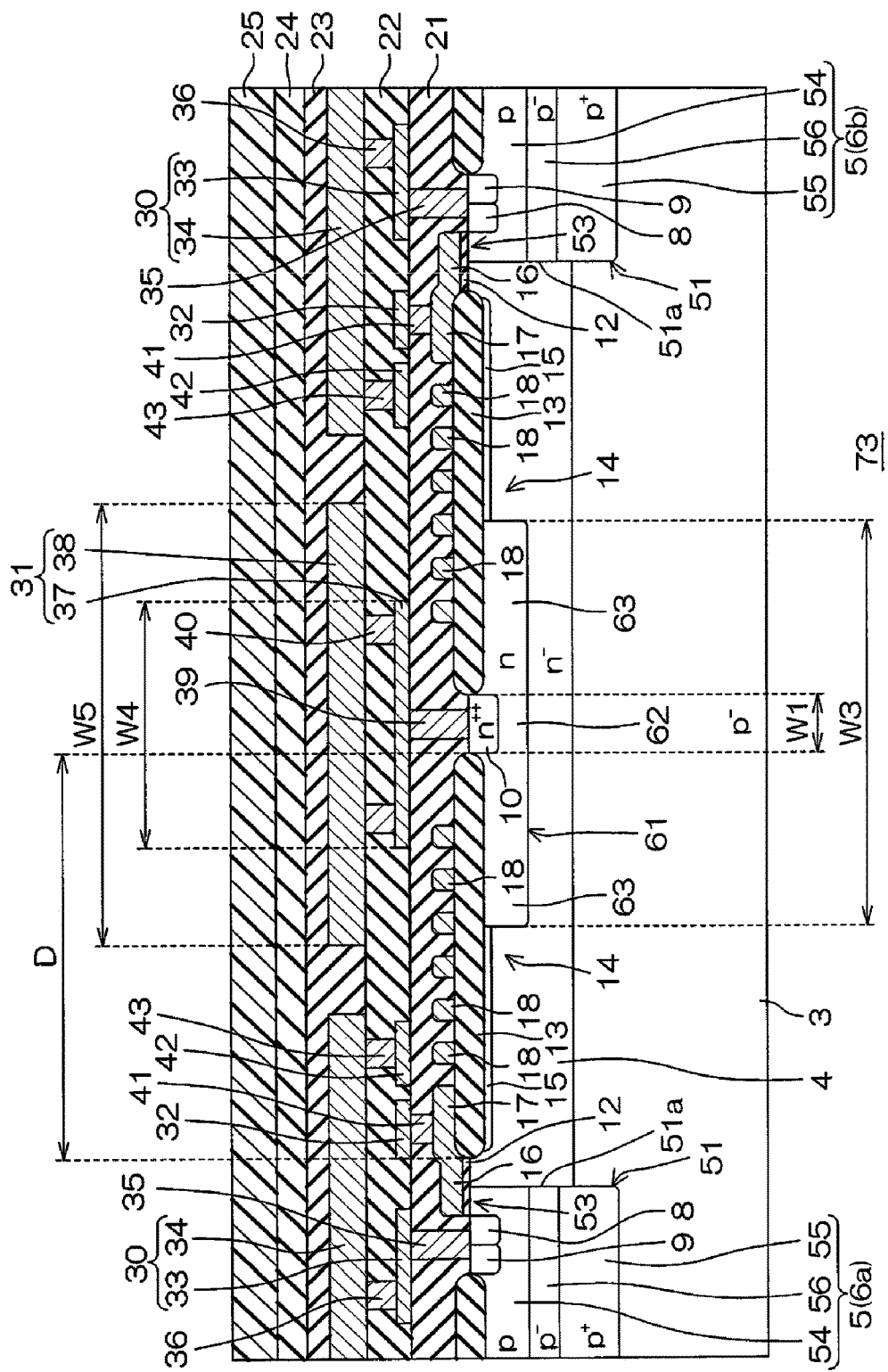
FIG. 10 is a longitudinal sectional view of a semiconductor device according to a fourth embodiment of the present disclosure.

FIG. 10 is a longitudinal sectional view of a semiconductor device 73 according to a fourth embodiment of the present disclosure. FIG. 10 is a longitudinal sectional view of a portion corresponding to FIG. 3 described above. The semiconductor device 73 according to the fourth embodiment has substantially the same components as those of the semiconductor device 1 according to the aforementioned first embodiment, except that it does not have the aforementioned drain buffer region 11. In FIG. 10, the same components as those described in the aforementioned first embodiment will be denoted by the same reference numerals and descriptions thereof will be omitted.

As illustrated in FIG. 10, the well region 61 is formed on the epitaxial layer 4 directly under the drain region 10. The well region 61 is formed in a linear shape in the plan view (an oval shape in the plan view in this embodiment) so as to extend along the drain region 10 with a space from the body region 5, and has a facing portion 62 facing the drain region 10 and a lead-out portion 63 extending from the facing portion 62 toward the source region 8.

In this embodiment, the periphery the lead-out portion 63 of the well region 61 extends to the outside of the periphery of the first drain metal 37 in the plan view, while it is disposed on the inner side of the periphery of the second drain metal 38. Thus, a relational expression of W4<W3<W5 is established among a width W3 of the well region 61 in the traverse direction, a width W4 of the first drain metal 37 in a traverse direction, and a width W5 of the second drain metal 38 in the traverse direction.

The lead-out portion 63 of the well region 61 is formed to overlap some of the field plates 18 (three field plates 18 counting from the innermost side in this embodiment) in the plan view.

In the semiconductor device 73 according to this embodiment, by the lead-out portion 63 of the well region 61 extending to the side of the drain region 10, it is possible to suppress the equipotential lines extending from the drain metal 31 from being bent toward the drain region 10 near the surface of the epitaxial layer 4. In addition, the lead-out portion 63 of the well region 61 is formed to overlap some (three field plates 18 in this embodiment) of the field plates in the plan view.

According to the field plates 18, since the equipotential lines extending from the drain metal 31 can suppress disturbance near the surface of the epitaxial layer 4, it is possible to suppress disturbance of an electric field of the epitaxial layer 4. Thus, by disposing the lead-out portion 63 of the well region 61 in a region of the epitaxial layer 4 in which disturbance of an electric field is suppressed, it is possible to properly suppress occurrence of local electric field concentration between the drain region 10 and the source region 8. As a result, it is possible to provide the semiconductor device 73 that can advantageously improve a withstand voltage.

Even in this embodiment, it may be configured such that the periphery of the lead-out portion 63 of the well region 61 extends to the outside of the periphery of the first drain metal 37 in the plan view. That is, similar to the aforementioned first embodiment, a relational expression of W4<W5<W3 is established among a width W3 of the well region 61 in a traverse direction, a width W4 of the first drain metal 37 in the traverse direction, and a width W5 of the second drain metal 38 in the traverse direction.

<Fifth Embodiment>

Figure 11:
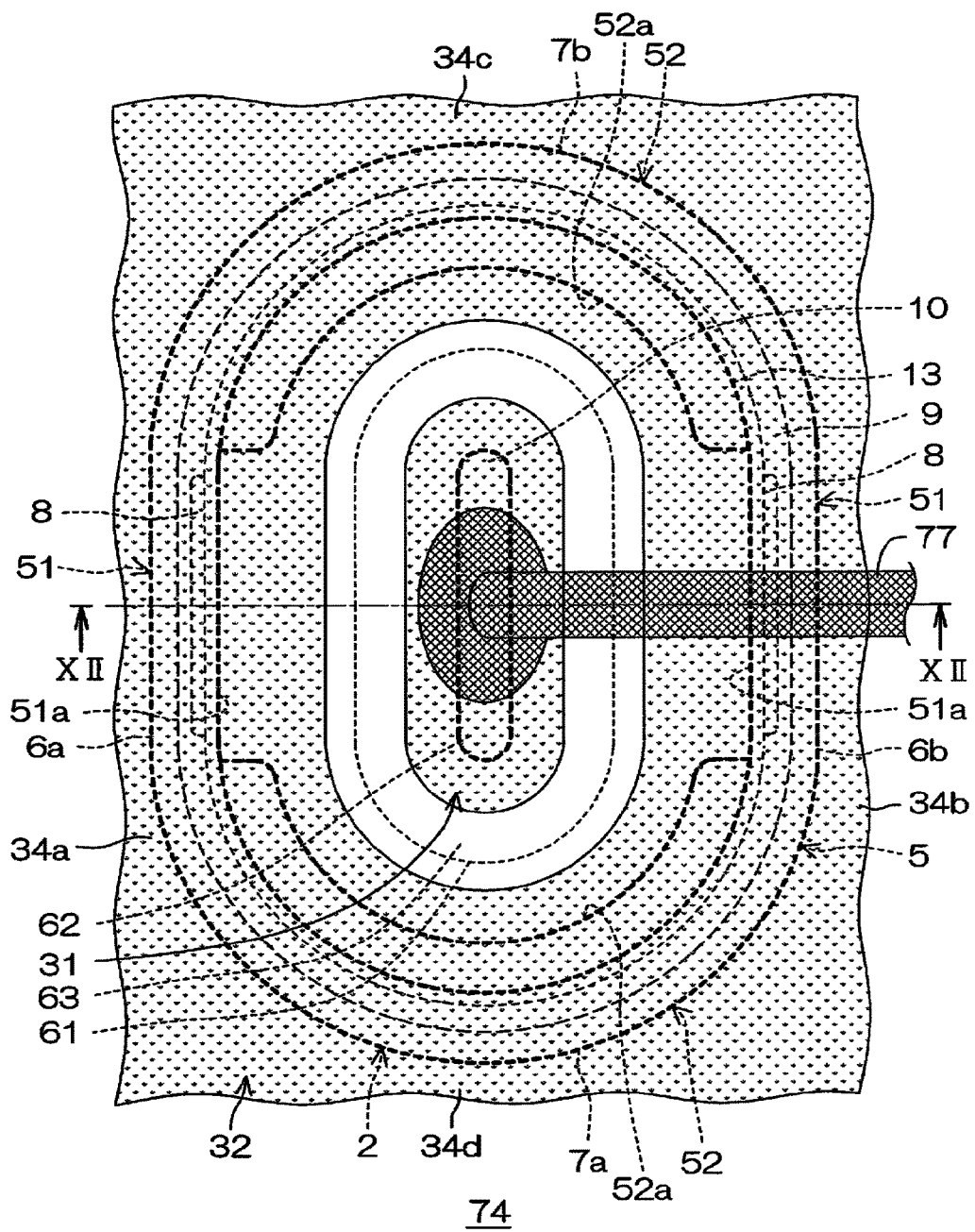
FIG. 11 is a plan view of a semiconductor device according to a fifth embodiment of the present disclosure.
Figure 12:
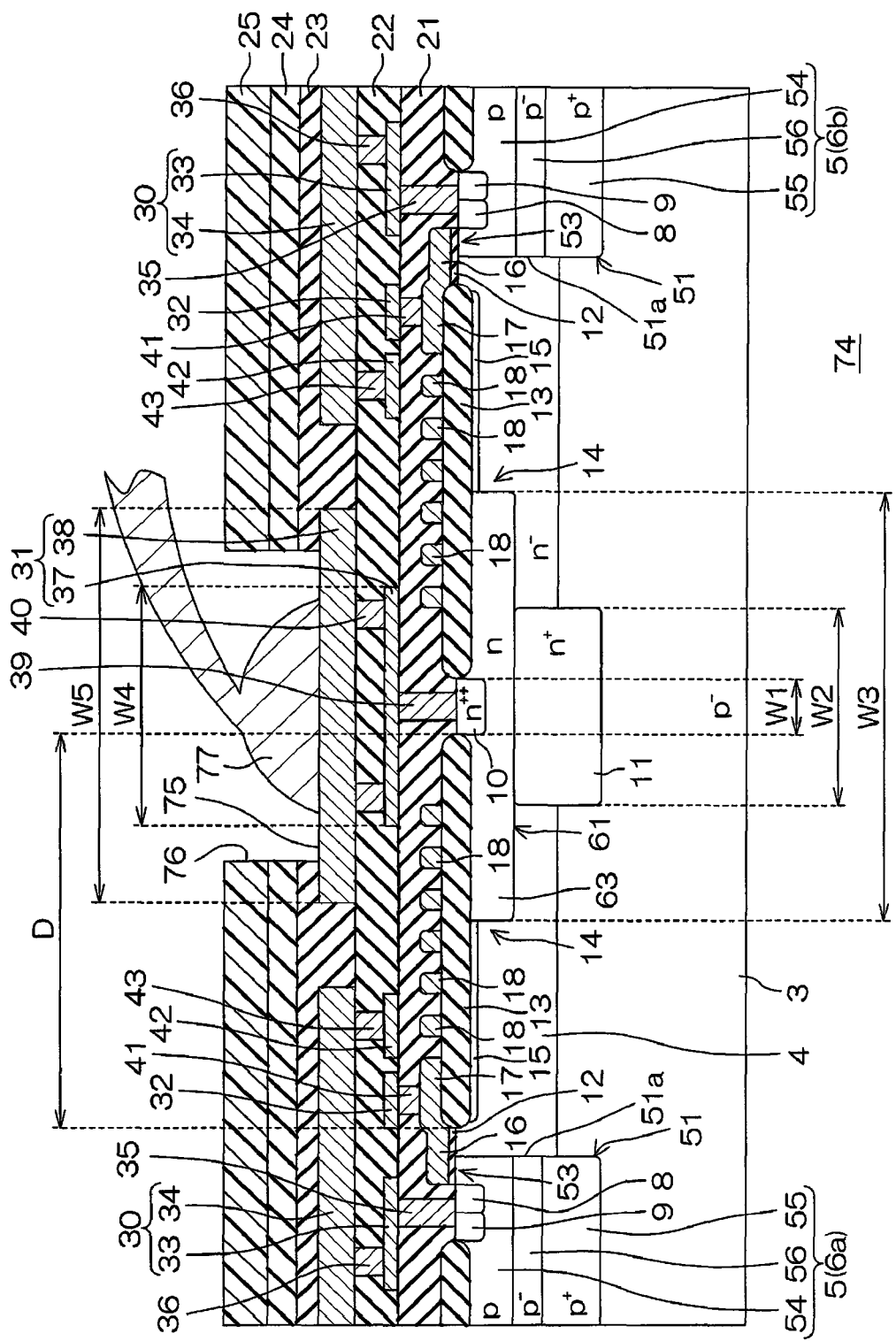
FIG. 12 is a longitudinal sectional view taken along line XII-XII of FIG. 11.

FIG. 11 is a plan view of a semiconductor device 74 according to a fifth embodiment of the present disclosure. FIG. 12 is a longitudinal sectional view taken along line XII-XII of FIG. 11. In FIG. 11, the same components as those described in the aforementioned first embodiment will be denoted by the same reference numerals and descriptions thereof will be omitted.

As illustrated in FIG. 11, in this embodiment, the second source metal 34 includes a connection portion 34*d* which is formed along the curved portion 7*a* of one side of the body region 5 and connects the pair of first portions 34*a* and 34*b*, in addition to the pair of first portions 34*a* and 34*b* and the connection portion 34*c*. Meanwhile, the drain metal 31 includes a second drain metal 38 in the form of island disposed within a region surrounded by the second source metal 34. The second drain metal 38 is formed in an oval shape in the plan view.

As illustrated in FIG. 12, a pad opening 76 for exposing a portion of an upper surface of the second drain metal 38 as an electrode pad 75 is formed in the passivation film 24 and the resin film 25. A bonding wire 77 for supplying electric power to the drain metal 31 from the outside is bonded to the electrode pad 75. Referring to FIGS. 11 and 12, the lead-out portion 63 of the well region 61 is configured such that its periphery extends to the outside of the entire periphery of the second drain metal 38 in the island shape.

Even with this configuration, the same effects as those mentioned in the aforementioned first embodiment may be achieved.

Although the embodiments of the present disclosure have been described above, the present disclosure may also be implemented in different embodiments.

Figure 13:
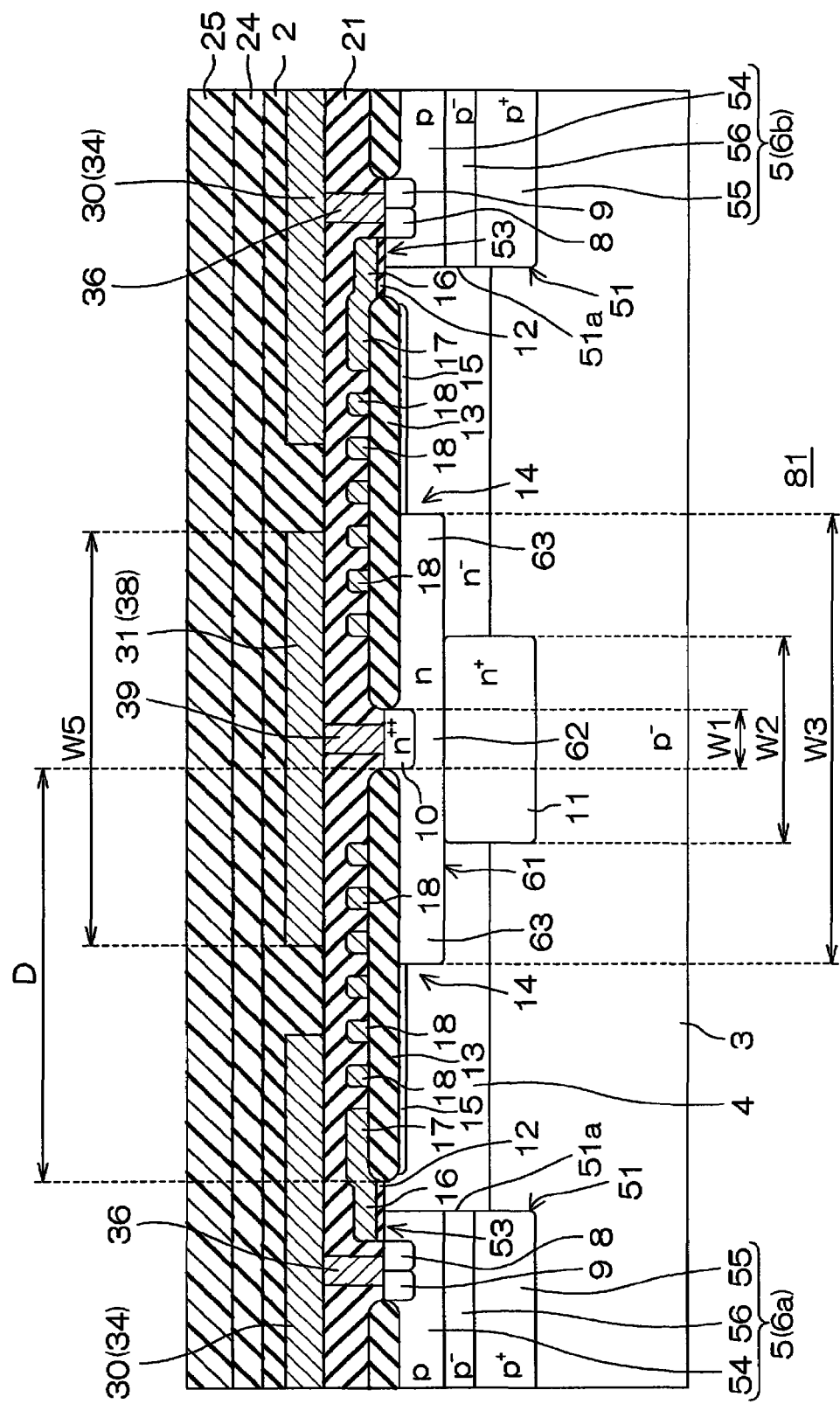
FIG. 13 is a longitudinal sectional view of a semiconductor device according to a first modification of the first embodiment.

For example, in each embodiment described above, there has been described the example in which the source metal 30 has the laminated structure including the first source metal 33 and the second source metal 34, and the drain metal 31 has the laminated structure including the first drain metal 37 and the second drain metal 38. Instead, the configuration illustrated in FIG. 13 may be employed. FIG. 13 is a longitudinal sectional view of a semiconductor device 81 according to a first modification of the first embodiment. In FIG. 13, the same components as those described in the aforementioned first embodiment will be denoted by the same reference numerals and descriptions thereof will be omitted.

As illustrated in FIG. 13, in a semiconductor device 81, the source metal 30 has a monolayer structure including only the second source metal 34, and the drain metal 31 has a monolayer structure including only the second drain metal 38. Even by employing the source metal 30 and the drain metal 31 having the monolayer structure, the same effects as those mentioned in the aforementioned first embodiment may also be achieved. The configuration illustrated in FIG. 13 may also be applied to the aforementioned second to fifth embodiments.

Further, in each embodiment described above, there has been described the example in which the periphery of the second drain metal 38 extends to the outside of the periphery of the first drain metal 37. However, instead, the periphery of the first drain metal 37 may extend to the outside of the periphery of the second drain metal 38. In this case, the lead-out portion 63 of the well region 61 is configured such that its periphery extends to the outside of at least the periphery of the first drain metal 37. Even in the second to fifth embodiments, the configuration in which the periphery of the first drain metal 37 extends to the outside of the periphery of the second drain metal 38 may also be employed.

Further, in each embodiment described above, there has been described the example in which the semiconductor device 1 includes the oval body region 5 having the linear portions 6*a* and 6*b* and the curved portions 7*a* and 77 in the plan view. However, instead, the configuration illustration in FIG. 14 may be employed. FIG. 14 is a plan view of a semiconductor device 82 according to a second modification of the first embodiment. In FIG. 14, the same components as those described in the aforementioned first embodiment will be denoted by the same reference numerals and descriptions thereof will be omitted.

As illustrated in FIG. 14, in the semiconductor device 82, the annular body region 5 in the plan view is employed instead of the oval body region 5 in the plan view. The source region 8 and the body contact region 9 may be formed in an annular shape in the plan view along the body region 5. The drain region 10, the drain buffer region 11, and the well region 61 may also be formed in a circular shape in the plan view. The LOCOS film 13 may also be formed in an annular shape in the plan view depending on a shape of the body region 5 or the drain region 10. Also in other components, it may be appropriately modified depending on a shape of the body region 5. Further, as illustrated in FIG. 14, in the body region 5, two or more second body portions 52 may be formed. Also, the configuration illustrated in FIG. 14 may also be applied to the aforementioned second to fifth embodiments.

Further, there has been described the example in which the LOCOS film 13 is formed in the region between the source region 7 and the drain region 10 has been described. However, instead of the LOCOS film 13, shallow trench isolation (STI) may be formed in the region between the source region 7 and the drain region 10. The STI includes an annular trench in the plan view which is formed by digging down the epitaxial layer 4 between the source region 8 and the drain region 10 and an insulator (a silicon oxide, a silicon nitride or the like) embedded in the trench.

The aforementioned semiconductor devices 1, 72, 73, 74, 81, and 82 may be integrated into a power module used in an inverter circuit for driving an electric motor used as a power source of, for example, an automobile (including an electric vehicle), a street car, an industrial robot, an air-conditioning appliance, an air-compressor, an electric fan, a cleaner, a dryer, a refrigerator, or the like. Further, the aforementioned semiconductor devices 1, 72, 73, 74, 81, and 82 may also be integrated into a power module used in an inverter circuit of a solar cell, a wind power generator, or any other generator, and may also be integrated into a circuit module constituting an analog control power source, a digital control power source, or the like.

In addition, various design changes may be made within the scope of the matters described in the claims.

The semiconductor device according to one embodiment of the present disclosure includes the drain buffer region formed in the semiconductor substrate and in the semiconductor layer. Thus, since the p-n junction portion can be formed between the semiconductor substrate and the drain buffer region, it is possible to improve a withstand voltage of the semiconductor device by using the depletion layer extending from the p-n junction portion. In addition, the semiconductor device according to this embodiment is configured such that the periphery of the lead-out portion of the well region extends to the outside of the periphery of the drain metal in the plan view. This makes it possible to suppress the equipotential lines extending from the drain metal from being bent toward the drain region near the surface of the semiconductor layer. As a result, since the occurrence of the local electric field concentration between the drain region and the source region can be suppressed, it is possible to provide the semiconductor device that can advantageously improve a withstand voltage.

The semiconductor device according to another embodiment of the present disclosure is configured such that the periphery of the lead-out portion of the well region extends to the outside of the periphery of the drain metal in the plan view. This makes it possible to suppress the equipotential lines extending from the drain metal from being bent toward the drain region near the surface of the semiconductor layer. As a result, since the occurrence of local electric field concentration between the drain region and the source region can be suppressed, it is possible to provide the semiconductor device that can improve a withstand voltage.

The semiconductor device according to yet another embodiment of the present disclosure includes the drain buffer region whose periphery extends to the outside of the periphery of the drain region. According to such a drain buffer region, it is possible to suppress the equipotential lines extending from the drain metal from being bent toward the drain region near the surface of the semiconductor layer. In addition, in the semiconductor device according to this embodiment of the present disclosure, the periphery of the lead-out portion of the well region disposed above the drain buffer region extends to the outside of the periphery of the drain buffer region in the plan view. This makes it possible to advantageously suppress the equipotential lines extending from the drain metal from being bent toward the drain region near the surface of the semiconductor layer. As a result, since the occurrence of the local electric field concentration between the drain region and the source region can be advantageously suppressed, it is possible to provide the semiconductor device that can advantageously improve a withstand voltage.

The semiconductor device according to a further embodiment of the present disclosure includes the plurality of field plates disposed on the insulating film so as to be in an electrically floating state. According to the field plates, it is possible to allow the equipotential lines extending from the drain metal to suppress disturbance near the surface of the semiconductor layer. That is, it is possible to suppress disturbance of an electric field in the semiconductor layer by the field plates. In addition, in the semiconductor device according to this embodiment of the present disclosure, the lead-out portion of the well region extends to the side of the drain region and overlaps with some of the field plates in the plan view.

This makes it possible to suppress the equipotential lines extending from the drain metal from being bent toward the drain region near the surface of the semiconductor layer. Furthermore, since the lead-out portion of the well region is disposed in the region where disturbance of an electric field in the semiconductor layer is suppressed, it is possible to advantageously suppress the occurrence of the local electric field concentration between the drain region and the source region. As a result, it is possible to provide the semiconductor device that can advantageously improve a withstand voltage.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a semiconductor substrate with a first conductivity type;
   a semiconductor layer with a second conductivity type formed on the semiconductor substrate;
   a drain region with the second conductivity type and a source region with the second conductivity type formed to be spaced apart from each other in a surface region of the semiconductor layer;
   a drain buffer region with the second conductivity type formed in the semiconductor substrate directly under the drain region and in the semiconductor layer;
   a conductivity type well region with the second conductivity type formed on the semiconductor layer between the drain region and the drain buffer region, the well region having a facing portion facing the drain region and a lead-out portion extending from the facing portion toward the source region; and
   a drain metal formed on the drain region to be electrically connected to the drain region and to overlap the well region in a plan view, the drain metal comprising:
   a first drain metal formed on the drain region; and
   a second drain metal which is formed on the first drain metal and whose periphery extends to an outside of a periphery of the first drain metal in the plan view,
   wherein a periphery of the lead-out portion of the well region extends to an outside of a periphery of the second drain metal in the plan view, and
   wherein the periphery of the first drain metal extends to an outside of a periphery of the drain buffer region in the plan view.

2. The device of claim 1, wherein the drain buffer region has an impurity concentration which is higher than that of the semiconductor layer and lower than that of the drain region, and
   wherein the well region has an impurity concentration which is higher than that of the semiconductor layer and lower than that of the drain buffer region.

3. The device of claim 1, wherein the drain buffer region is contained inside the well region in the plan view.

4. The device of claim 1, further comprising:
an insulating film formed to cover a region between the drain region and the source region on a surface of the semiconductor layer; and
a plurality of field plates formed on the insulating film to be in an electrically floating state,
wherein the lead-out portion of the well region is formed to overlap a part of the plurality of field plates in the plan view.

5. A semiconductor device, comprising:
a semiconductor substrate with a first conductivity type;
a semiconductor layer with a second conductivity type formed on the semiconductor substrate;
a drain region with the second conductivity type and a source region with the second conductivity type formed to be spaced apart from each other in a surface region of the semiconductor layer;
a well region with the second conductivity type formed on the semiconductor layer directly under the drain region, the well region having a facing portion facing the drain region and a lead-out portion extending from the facing portion toward the source region; and
a drain metal formed on the drain region to be electrically connected to the drain region and to overlap the well region in a plan view, the drain metal comprising:
a first drain metal which is formed on the drain region and has a periphery that extends to an outside of a periphery of the drain region in the plan view; and
a second drain metal which is formed on the first drain metal and has a periphery that extends to an outside of the periphery of the first drain metal in the plan view,
wherein a periphery of the lead-out portion of the well region extends to an outside of the periphery of the second drain metal in the plan view.

6. A semiconductor device, comprising:
a semiconductor substrate with a first conductivity type;
a semiconductor layer with a second conductivity type formed on the semiconductor substrate;
a drain region with the second conductivity type and a source region with the second conductivity type formed to be spaced apart from each other in a surface region of the semiconductor layer;
a drain buffer region with the second conductivity type formed in the semiconductor substrate directly under the drain region and in the semiconductor layer, a periphery of the drain buffer region being extending to an outside of a periphery of the drain region;
a well region with the second conductivity type formed on the semiconductor layer between the drain region and the drain buffer region, the well region having a facing portion facing the drain region and a lead-out portion extending from the facing portion toward the source region; and
a drain metal formed on the drain region to be electrically connected to the drain region and to overlap the well region in a plan view, the drain metal comprising:
a first drain metal which is formed on the drain region and has a periphery that extends to the outside of the periphery of the drain region in the plan view; and
a second drain metal which is formed on the first drain metal and has a periphery that extends to an outside of the periphery of the first drain metal in the plan view,
wherein a periphery of the lead-out portion of the well region extends to an outside of the periphery of the drain buffer region in the plan view.

7. A semiconductor device, comprising:
a semiconductor substrate with a first conductivity type;
a semiconductor layer with a second conductivity type formed on the semiconductor substrate;
a drain region with the second conductivity type and a source region with the second conductivity type formed to be spaced apart from each other in a surface region of the semiconductor layer;
a well region with the second conductivity type formed on the semiconductor layer directly under the drain region, the well region having a facing portion facing the drain region and a lead-out portion extending from the facing portion toward the source region;
an insulating film formed to cover a region between the drain region and the source region on a surface of the semiconductor layer;
a plurality of field plates formed above the insulating film to be in an electrically floating state; and
a drain metal formed on the drain region to be electrically connected to the drain region and to overlap the well region in a plan view, the drain metal comprising:
a first drain metal which is formed on the drain region and has a periphery that extends to an outside of a periphery of the drain region in the plan view; and
a second drain metal which is formed on the first drain metal and has a periphery that extends to an outside of the entire periphery of the first drain metal in the plan view,
wherein the lead-out portion of the well region has a periphery that extends to the outside of the periphery of the first drain metal, and
wherein the lead-out portion of the well region is formed to overlap a part of the plurality of field plates in the plan view.

* * * * *